United States Patent
Hikita et al.

(10) Patent No.: US 6,724,084 B1
(45) Date of Patent: Apr. 20, 2004

(54) SEMICONDUCTOR CHIP AND PRODUCTION THEREOF, AND SEMICONDUCTOR DEVICE HAVING SEMICONDUCTOR CHIP BONDED TO SOLID DEVICE

(75) Inventors: Junichi Hikita, Kyoto (JP); Goro Nakatani, Kyoto (JP); Nobuhisa Kumamoto, Kyoto (JP); Katsumi Sameshima, Kyoto (JP); Kazutaka Shibata, Kyoto (JP); Shigeyuki Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/499,384

(22) Filed: Feb. 7, 2000

(30) Foreign Application Priority Data

| Feb. 8, 1999 | (JP) | 11-029842 |
| Feb. 10, 1999 | (JP) | 11-033116 |
| Feb. 18, 1999 | (JP) | 11-040400 |
| Feb. 26, 1999 | (JP) | 11-051212 |
| Sep. 20, 1999 | (JP) | 11-265739 |

(51) Int. Cl.$^7$ .................. H01L 23/48; H01L 23/52
(52) U.S. Cl. .................. 257/737; 257/777; 257/778
(58) Field of Search .................. 257/717, 737, 257/738, 777, 778, 780, 619, 620; 438/108, 613

(56) References Cited

U.S. PATENT DOCUMENTS 5,269,453 A * 12/1993 Melton et al. ......... 228/180.22
6,022,792 A * 2/2000 Ishii et al. .................. 438/462

FOREIGN PATENT DOCUMENTS

| JP | 53-048469 | 5/1978 |
| JP | 58-091646 | 5/1983 |
| JP | 61-125141 | 6/1986 |
| JP | 63-107127 | 5/1988 |
| JP | 1-237148 | 9/1989 |
| JP | 6-37143 | 11/1990 |
| JP | UM 4-99537 | 8/1992 |
| JP | 2-267942 | 2/1994 |
| JP | 08-139096 | 5/1996 |
| JP | 10-270637 | 10/1998 |

* cited by examiner

*Primary Examiner*—Hung Vu
(74) *Attorney, Agent, or Firm*—Rabin & Berdo, P.C.

(57) ABSTRACT

A semiconductor chip having a functional bump provided on a surface of a semiconductor substrate thereof for electrical connection between an internal circuit thereof and a solid device, and a dummy bump not serving for the electrical connection between the internal circuit and the solid device. The dummy bump may be a stress relieving bump for relieving stresses exerted thereon. The dummy bump may be connected to a low impedance portion. The functional bump and the dummy bump may be provided on a surface protective film. In this case, the dummy bump is provided on a recess formed in the surface protective film.

8 Claims, 22 Drawing Sheets

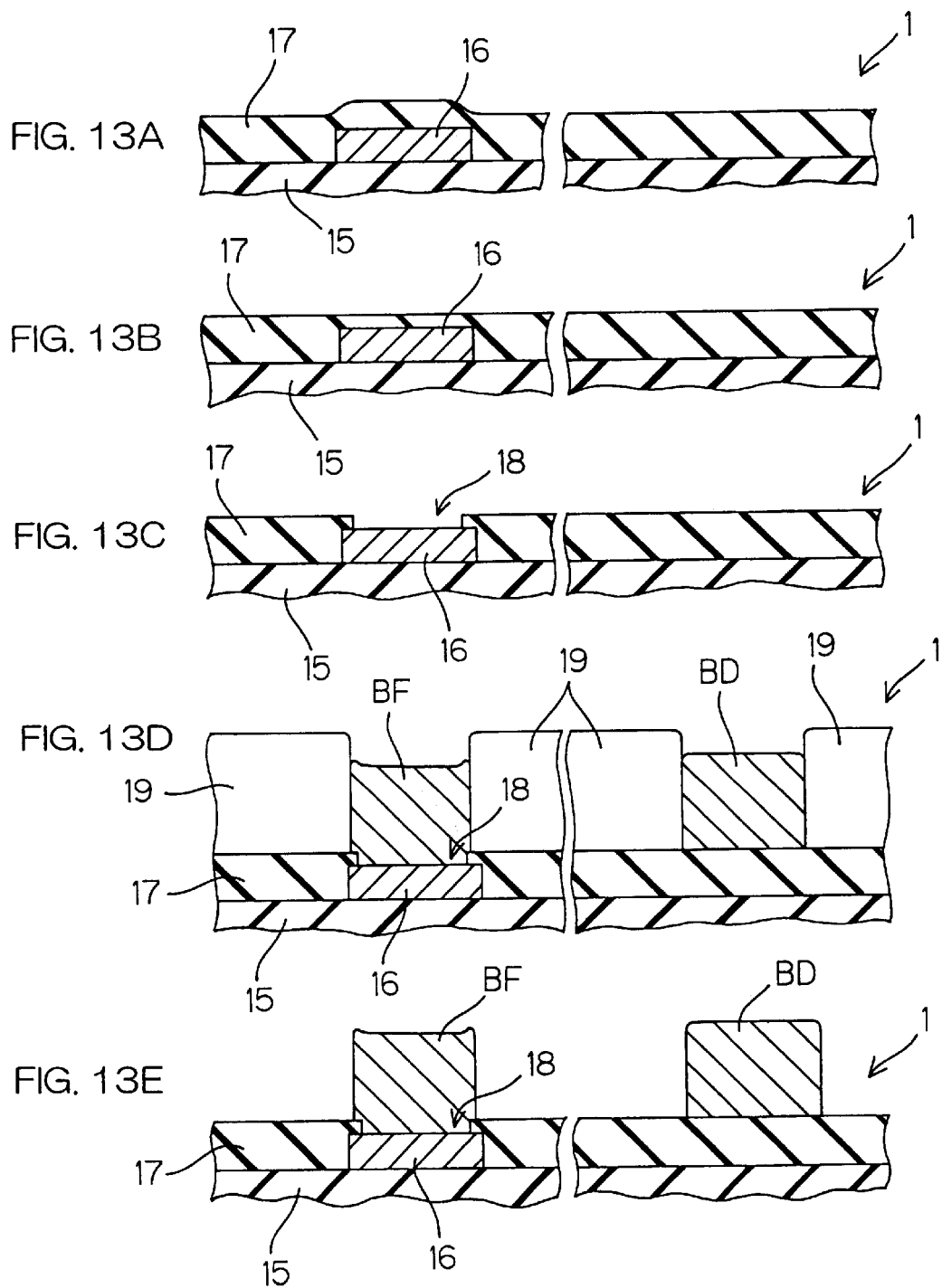

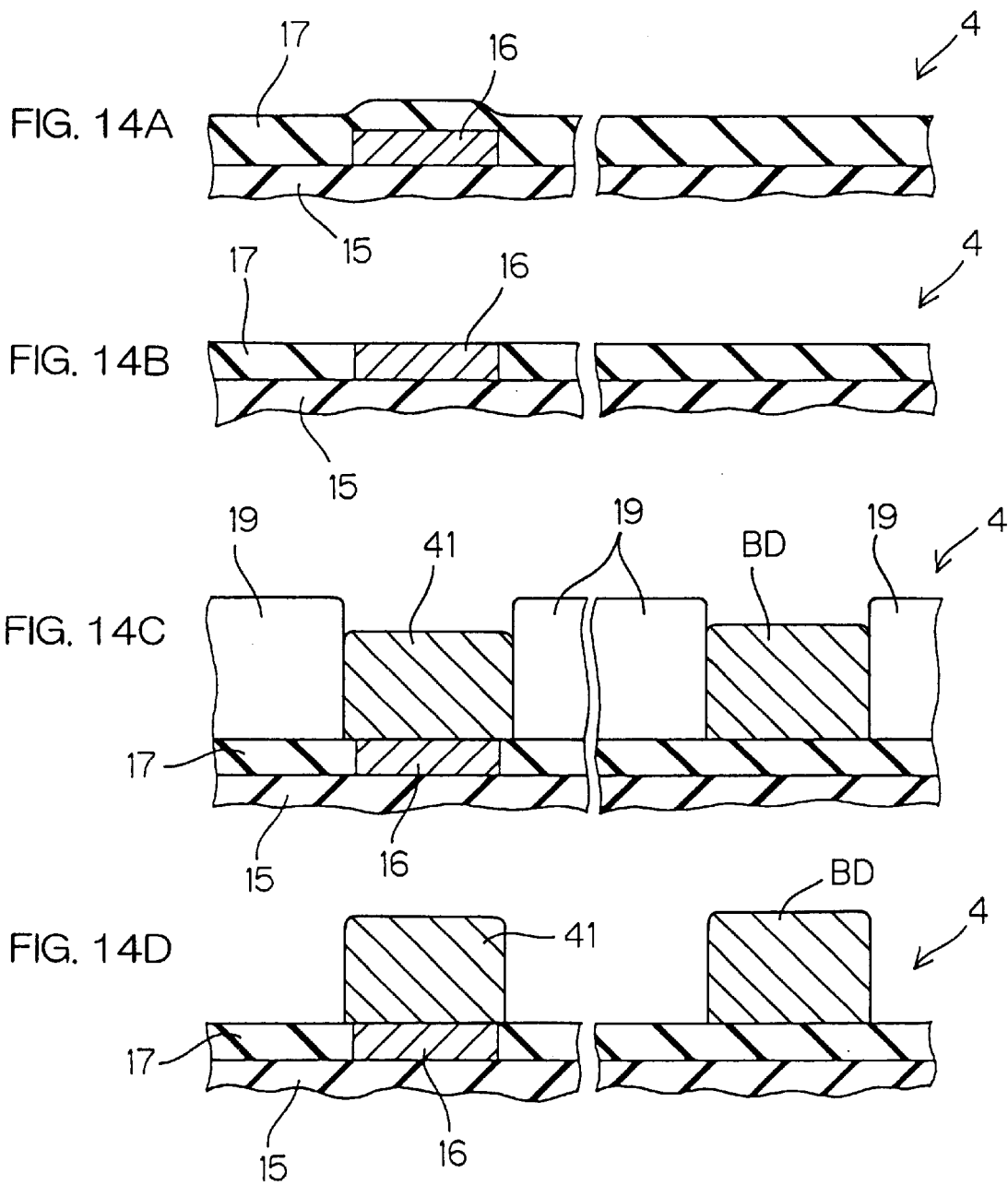

SEMICONDUCTOR CHIP AND PRODUCTION THEREOF, AND SEMICONDUCTOR DEVICE HAVING SEMICONDUCTOR CHIP BONDED TO SOLID DEVICE

BACKGROUND OF THE INVENTION

1. Field of the Invention

The present invention relates to a semiconductor chip to be applied to a chip-on-chip structure in which semiconductor chips are bonded to each other in a stacked relation and a flip-chip-bonded structure in which a semiconductor chip is bonded to a printed circuit board in a face-to-face relation. The invention further relates to a production method for such a semiconductor chip. The invention still further relates to a semiconductor device having a semiconductor chip bonded to a solid device (another semiconductor chip or an interconnection board).

2. Description of Related Art

For size reduction and higher integration of a semiconductor device, a so-called chip-on-chip structure, for example, is employed in which a plurality of semiconductor chips are bonded to one another in a face-to-face stacked relation.

In the chip-on-chip structure, as shown in FIG. 25, semiconductor chips 91, 92 opposed to each other are spaced a predetermined distance from each other and electrically connected to each other by a plurality of bumps 93 provided therebetween. The semiconductor chips 91, 92 thus stacked are sealed with a mold resin 94.

When the semiconductor chips 91, 92 are sealed with the mold resin 94, a relatively great pressure is applied to the semiconductor chips by the mold resin 94. Where the semiconductor chips 91, 92 are different in thermal expansion coefficient, strains occur in the semiconductor chips 91, 92 due to stresses exerted thereon when a relatively great amount of heat is applied thereto at the resin sealing. Thus, portions of the semiconductor chips 91, 92 not supported by the bumps 93 are deformed, resulting in deterioration of the characteristics of devices formed in the semiconductor chips 91, 92.

For electrical connection between the semiconductor chips 91 and 92, at least one of surface protective films covering the semiconductor chips is formed with openings through which portions of internal interconnections are exposed, and the bumps 93 are provided on the exposed portions of the internal interconnections. Therefore, the arrangement of the bumps 93 is restricted by the pattern of the internal interconnections and, in some cases, the bumps 93 are unevenly disposed on the surface of the semiconductor chip in accordance with the internal interconnection pattern. Where the bumps 93 are unevenly disposed on the surface thereof, for example, the chip 92 may be tilted on the underlying chip 91.

When the chips 91, 92 are bonded to each other, great stresses are exerted on bump connections. Therefore, the semiconductor substrate provided with the bumps 93 may suffer from a mechanical damage. For prevention of the damage, an attempt has been made to absorb the stresses by utilizing the resilient property of the electrical connection bumps. However, the absorption of the stresses is in sufficient, so that the substrate is damaged. This results in a lower yield.

Further, the substrate often suffers from warpage due to heat applied thereto at mounting of the semiconductor device, so that great stresses are exerted on the bump connections.

The afore said problems are associated not only with the semiconductor device of chip-on-chip structure, but also with a semiconductor device of so-called flip-chip-bonded structure in which a semiconductor chip is bonded to a printed circuit board in a face-to-face opposed relation.

SUMMARY OF THE INVENTION

It is a first object of the present invention to provide a semiconductor chip which is allowed to exhibit stable device characteristics by prevention of deformation thereof due to stress-strains and the like.

It is a second object of the invention to provide a semiconductor chip which is capable of relieving a stress applied thereto at the bonding thereof.

It is a third object of the invention to provide a semiconductor chip production method which allows an electrical connection portion (functional bump) and a dummy connection portion (dummy bump) to have substantially the same height.

It is a fourth object of the invention to provide a semiconductor device which features reliable connection between a semiconductor chip and a solid device, e.g., another semiconductor chip, and to provide a semiconductor chip for such a semiconductor device.

A semiconductor chip according to the present invention comprises: a semiconductor substrate; a functional bump provided on a surface of the semiconductor substrate for electrical connection between an internal circuit provided on the semiconductor substrate and a solid device; and a dummy bump provided on the surface of the semiconductor substrate and not serving for the electrical connection between the internal circuit and the solid device.

The dummy bump may be a stress relieving bump for relieving a stress applied thereto.

The solid device may be another semiconductor chip or an interconnection board.

The stress relieving bump may be provided in a semiconductor chip formation region or in a peripheral region surrounding the semiconductor chip formation region.

With this arrangement, the bump which does not have the originally intended bump function serves to absorb a shock at the bonding of the chip. Therefore, the substrate is prevented from being damaged at the bonding, so that the semiconductor chip production yield can be improved. During use, the bump connection relieves a stress exerted on the substrate, thereby ensuring the reliability of the semiconductor chip.

The functional bump may be provided on a peripheral portion of a mating surface opposed to the solid device. In this case, the dummy bump is preferably provided on a central portion of the mating surface.

With this arrangement, the central portion of the semiconductor chip can be supported by the dummy dump. Therefore, the deformation of the semiconductor chip can be prevented which may otherwise occur due to a mechanical pressure and a stress-strain. Thus, the semiconductor chip can exhibit stable device characteristics.

The dummy bump preferably has a greater contact area in contact with the solid device than the functional bump.

When the dummy bump is provided on the surface of the semiconductor chip, the dummy bump is preferably formed of the same material as the function bump which serves for electrical connection to another semiconductor chip opposed thereto. Thus, the formation of the dummy bump and the formation of the functional bump can be achieved in the same process step, whereby an increase in the number of the steps of a semiconductor chip production process can be prevented.

In this case, however, there is a problem that the functional bump and the dummy bump have different projection heights. As shown in FIG. 23, a bump material is selectively deposited on a surface protective film 193 formed with an opening 192 through which an interconnection 191 is partly exposed. Thus, a functional bump 194 and a dummy bump 195 are formed on the opening 192 and on the surface protective film 193, respectively. In this case, a portion of the surface protective film 193 around the opening 192 is raised with respect to the other portion, so that the functional bump 194 has a projection height which is greater by $\Delta h$ than the dummy bump 195. With the functional bump 194 higher than the dummy bump 195, the dummy bump 195 cannot properly be brought into contact with another semiconductor chip when the semiconductor chip is mounted on the another semiconductor chip. Therefore, the dummy bump fails to satisfactorily exhibit its function.

Where the dummy bump and the functional bump are formed in the same process step, there is a level difference, as shown in FIG. 24, between the surface of a surface protective film 291 and the surface of an internal interconnection 293 exposed through an opening 292 formed in the surface protective film 291, so that the dummy bump denoted at 294 has a projection height which is greater by $\Delta d$ than a projection height of the functional bump denoted at 295 as measured from the surface of the surface protective film 291. Where this semiconductor chip is employed as a primary chip or a secondary chip, the functional bump 295 cannot properly be bonded to a functional bump of another semiconductor chip because the dummy bump 294 has a greater projection height than the functional bump 295. Therefore, electrical connection between the semiconductor chips cannot be established.

In accordance with one embodiment of the invention, the dummy bump is connected to a low impedance portion. With this arrangement, although the dummy dump may serve as an antenna, there is no possibility that external noises are introduced into the semiconductor chip. Therefore, the semiconductor chip exhibits stable device characteristics.

The low impedance portion may be the semiconductor substrate which serves as a base of the semiconductor chip.

It is preferred that a connection portion of the low impedance portion of the semiconductor substrate has been subjected to a resistance reducing process. Thus, the resistance of the low impedance portion can be reduced, so that an adverse effect of the external noises can more effectively be prevented.

The dummy bump may be connected to a scribe line region of the semiconductor substrate. Where the dummy bump is comprised of a plating-metallization layer formed on a seed layer provided on the surface of the semiconductor substrate, the seed layer preferably has an interconnection extending from the dummy bump to a scribe line.

In general, no surface protective film is provided on the scribe line region, so that the surface of the semiconductor substrate is exposed. Therefore, the dummy bump can easily be connected to the semiconductor substrate by connecting the dummy bump to the scribe line region via the seed film in accordance with the present invention.

The semiconductor substrate may be covered with a planarized surface protective film, on which the functional bump and the dummy bump are provided as projecting therefrom.

The functional bump may electrically be connected to an internal interconnection via an opening formed in the surface protective film. In this case, it is preferred that the dummy bump is formed on the surface protective film as electrically isolated from the internal circuit.

The surface protective film may be formed with a recess having a depth which corresponds to a distance between a surface of the surface protective film and the internal interconnection, and the dummy bump may be provided on the recess. In this case, the depth of the recess is preferably determined so that the dummy bump has substantially the same projection height as the functional bump with respect to the surface of the surface protective film.

Thus, the electrical connection portion and the dummy connection portion have substantially the same projection height with respect to the surface of the semiconductor chip, even if the electrical connection portion and the dummy connection portion are formed in the same process step. Therefore, the electrical connection portion and the dummy connection portion can assuredly be connected to the surface of the solid device, whereby electrical connection between the semiconductor chip and the solid device can assuredly be established by the electrical connection portion and mechanical connection between the semiconductor chip and the solid device can assuredly be established by the electrical connection portion and the dummy connection portion.

Since the electrical connection portion and the dummy connection portion merely need to be formed as having the same height, the formation of the electrical connection portion and the dummy connection portion can easily be achieved in the same process step by plating or the like as in the prior art. Therefore, the semiconductor chip can be produced through a simplified process, as compared with a case where the electrical connection portion and the dummy connection portion are formed as having different heights to allow the electrical connection portion and the dummy connection portion to have substantially the same projection height.

Where the electrical connection portion is provided on the internal interconnection exposed through the opening formed in the surface protective film covering the semiconductor chip and the dummy connection portion is formed on the surface protective film, it is preferred that the recess is formed in the surface of the surface protective film and the recess has a depth which is virtually equal to a distance between the surface of the surface protective film and the surface of the internal interconnection.

The internal interconnection may have a surface portion which is exposed through the opening and is flush with the surface protective film, and the functional bump may be provided on the exposed surface portion. In this case, the functional bump and the dummy bump are allowed to have the same projection height merely by forming these bumps through the same process step.

In accordance with one inventive aspect, there is provided a semiconductor device, which comprises: a solid device; a semiconductor chip mounted and bonded onto a surface of the solid device; a functional bump for electrical connection between an internal circuit of the semiconductor chip and the solid device; and a dummy bump not serving for the electrical connection between the internal circuit and the solid device.

In accordance with another inventive aspect, there is provided a semiconductor device of a structure in which first and second solid devices are bonded to each other in a face-to-face opposed relation, at least one of the first and second solid devices being a semiconductor chip, the semiconductor device comprising: an electrical connection portion provided on a front face of the first solid device as projecting therefrom to join the first and second solid devices to each other with a predetermined distance therebetween and to electrically connect the first and second solid devices to each other; and a dummy connection portion provided on a front face of the second solid device as projecting therefrom to a projection height which is virtually equal to the predetermined distance, and not serving for the electrical connection between the first and second solid devices.

In accordance with the invention, the projection height of the dummy connection portion is virtually equal to the distance between the first solid device and the second solid device, so that the dummy connection portion can assuredly be bonded to the front face of the first solid device. Therefore, the electrical connection between the first and second solid devices can assuredly be established by the electrical connection portion, while mechanical connection between the first and second solid devices can assuredly be established by the electrical connection portion and the dummy connection portion.

It is preferred that the first solid device is not provided with any dummy connection portion which does not serve for the electrical connection between the first and second solid devices, and the second solid device is not provided with any electrical connection portion which joins the first and second solid devices to each other with the predetermined distance therebetween and electrically connects the first and second solid devices to each other. With this arrangement, the electrical connection portion and the dummy connection portion each having a predetermined height are formed on the first solid device and on the second solid device, respectively, so that the first and second solid devices can each be produced through a simplified process.

The second solid device may have a connection recess formed in the front face thereof in association with the electrical connection portion to receive a distal end portion of the electrical connection portion. In this case, the dummy connection portion preferably projects from the front face of the second solid device to a projection height which is virtually equal to a difference between a projection height of the electrical connection portion with respect to the front face of the first solid device and an insertion depth of the electrical connection portion in the connection recess.

More specifically, the projection height of the dummy connection portion with respect to the front face of the second solid device is virtually equal to the aforesaid predetermined distance, where the second solid device has the connection recess formed in the front face thereof in association with the electrical connection portion to receive the distal end portion of the electrical connection portion and the dummy connection portion has the projection height which is virtually equal to the difference between the projection height of the electrical connection portion with respect to the front face of the first solid device and the insertion depth of the electrical connection portion in the connection recess.

In accordance with further another inventive aspect, there is provided a semiconductor device of a structure in which first and second solid devices are bonded to each other in a face-to-face opposed relation, at least one of the first and second solid devices being a semiconductor chip, the semiconductor device comprising: a first electrical connection portion provided on a front face of the first solid device as projecting therefrom for electrical connection between the first solid device and the second solid device; a dummy connection portion provided on the front face of the first solid device as projecting therefrom and not serving for the electrical connection between the first and second solid devices; and a second electrical connection portion provided on a front face of the second solid device in association with the first electrical connection portion as projecting therefrom to a projection height which is virtually equal to a difference in projection height between the first electrical connection portion and the dummy connection portion as measured from the front face of the first solid device, and bonded to the first electrical connection portion for the electrical connection between the first and second solid devices.

Where the electrical connection portion is provided on an internal interconnection exposed through an opening formed in a surface protective film covering the semiconductor chip and the dummy connection portion is provided on the surface protective film, for example, the projection heights of the first electrical connection portion and the dummy connection portion with respect to the front face of the first solid device are different by a distance as measured from the surface of the surface protective film to the internal interconnection if the first electrical connection portion and the dummy connection portion have the same height. Therefore, the difference in the projection height is made up by providing the second electrical connection portion, whereby the first electrical connection portion and the second electrical connection portion can be bonded to each other when the dummy connection portion is brought into contact with the front face of the first solid device. Thus, the connection between the first solid device and the second solid device can assuredly be established.

Since it is merely necessary to form the first electrical connection portion and the dummy connection portion each having a predetermined height on the first solid device and to form the second electrical connection portion having a predetermined height on the second solid device, the first solid device and the second solid device can each be produced through a simplified process.

In accordance with one inventive aspect, there is provided a semiconductor chip production method for producing a semiconductor chip which is to be bonded to a surface of a solid device and includes an electrical connection portion provided on a front face thereof to be opposed to the surface of the solid device for electrical connection to the solid device and a dummy connection portion provided on the front face thereof and not serving for the electrical connection to the solid device, the method comprising the steps of: providing an internal interconnection on a semiconductor substrate which serves as a base of the semiconductor chip; forming a surface protective film over the internal interconnection; planarizing the surface protective film; forming an opening in the surface protective film to expose a portion of the internal interconnection; and forming an electrical connection portion connected to the internal interconnection via the opening and a dummy connection portion isolated from the internal interconnection by selective plating on the portion of the internal interconnection exposed through the opening and the planarized surface protective film after the surface protective film planarization step and the opening formation step.

In accordance with the invention, the electrical connection portion and the dummy connection portion can be formed as having the same height by thus performing the selective plating for the formation of the electrical connection portion and the dummy connection portion after the planarization of the surface of the surface protective film.

Therefore, the electrical connection portion and the dummy connection portion can properly be connected to the surface of the solid device. Thus, the electrical connection to the surface of the solid device can properly be established and, in addition, stresses exerted on the semiconductor chip and the surface of the solid device can advantageously be relieved by the dummy connection portion.

In accordance with another inventive aspect, there is provided a semiconductor chip production method for producing a semiconductor chip which is to be bonded to a surface of a solid device and includes an electrical connection portion provided on a front face thereof to be opposed to the surface of the solid device for electrical connection to the solid device and a dummy connection portion provided on the front face thereof and not serving for the electrical connection to the solid device, the method comprising the steps of: providing an internal interconnection on a semiconductor substrate; forming a surface protective film over the internal interconnection; exposing a surface of the internal interconnection from the surface protective film by planarizing the surface protective film by polishing; and forming an electrical connection portion connected to the surface of the internal interconnection exposed from the surface protective film and a dummy connection portion isolated from the internal interconnection by selective plating on the surface of the internal interconnection exposed from the surface protective film and the planarized surface protective film.

In accordance with the invention, the electrical connection portion and the dummy connection portion can be formed as having the same height by thus performing the selective plating for the formation of the electrical connection portion and the dummy connection portion after the internal connection is exposed by polishing the surface protective film.

Therefore, the electrical connection portion and the dummy connection portion can properly be connected to the surface of the solid device. Thus, the electrical connection to the surface of the solid device can properly be established and, in addition, stresses exerted on the semiconductor chip and the surface of the solid device can advantageously be relieved by the dummy connection portion.

The surface protective film polish-planarization step is preferably performed until the surface of the surface protective film becomes substantially flush with the surface of the internal interconnection exposed from the surface protective film.

In accordance with further another inventive aspect, there is provided a semiconductor chip production method for producing a semiconductor chip which is to be bonded to a surface of a solid device and includes an electrical connection portion provided on a front face thereof to be opposed to the surface of the solid device for electrical connection to the solid device and a dummy connection portion provided on the front face thereof and not serving for the electrical connection to the solid device, the method comprising the steps of: providing an internal interconnection on a semiconductor substrate; forming a surface protective film over the internal interconnection; planarizing the surface protective film; forming an opening for partly exposing the internal interconnection and a recess in the planarized surface protective film; forming a metal film over the surface protective film formed with the recess and the opening; and removing the metal film except portions thereof formed in the recess and the opening, whereby a dummy connection portion isolated from the internal interconnection and an electrical connection portion connected to the internal interconnection are formed in the recess and in the opening, respectively.

It is preferred that the step of forming the dummy connection portion and the electrical connection portion includes the step of polishing a surface of the metal film by a chemical mechanical polishing method, and the chemical mechanical polishing step is performed until the surface of the surface protective film becomes substantially flush with surfaces of metal film portions in the opening and the recess.

In accordance with the invention, the electrical connection portion and the dummy connection portion can be formed with the surfaces thereof being substantially flushed with the surface of the surface protective film by forming the recess and the opening in the planarized surface protective film, then forming the metal film on the surface protective film formed with the recess and the opening, and removing the metal film except the portions thereof formed in the recess and the opening for formation of the dummy connection portion and the electrical connection portion in the recess and in the opening, respectively.

Therefore, where the semiconductor chip is connected to a solid device having a functional bump and a dummy bump, for example, the functional bump and dummy bump of the solid device can properly be connected to the electrical connection portion and dummy connection portion, respectively, of the semiconductor chip. Thus, the electrical connection between the semiconductor chip and the solid device can properly be established and, in addition, stresses exerted on the semiconductor chip and the solid device can advantageously be relieved.

The foregoing and other objects, features and effects of the present invention will become more apparent from the following description of the preferred embodiments with reference to the attached drawings.

BRIEF DESCRIPTION OF THE DRAWINGS

FIGS. 13A to 13E are sectional views illustrating the construction of a major portion of a primary chip and a production process therefor in accordance with a fifth embodiment of the invention;

FIGS. 14A to 14D are sectional views illustrating the construction of a major portion of a semiconductor chip and a production process therefor in accordance with a sixth embodiment of the invention;

DESCRIPTION OF THE PREFERRED EMBODIMENTS

FIGS. 1A to 1E are sectional views of major portions for explaining the steps of a process for forming bumps of a semiconductor device in accordance with a first embodiment of the present invention. In FIGS. 1A to 1E, a device formation region and a peripheral region surrounding the device formation region are illustrated. The following explanation is directed to an Si-based semiconductor device, but the semiconductor device may be based on any of various semiconductors such as a Ge semiconductor, and GaAs and GaP compound semiconductors.

Figure 1A:
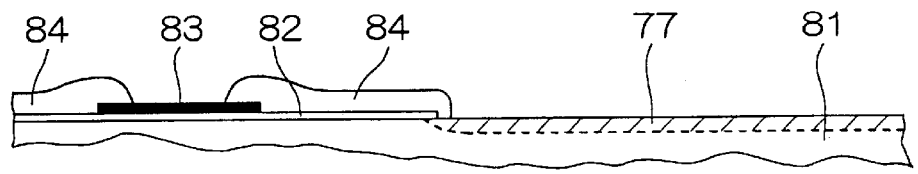
FIGS. 1A to 1E are sectional views of major portions for explaining a sequence of the steps of a process for forming bumps of a semiconductor device in accordance with a first embodiment of the present invention.

As shown in FIG. 1A, an Al electrode 83 (an exposed portion of an internal interconnection) is formed in a predetermined position on an Si-based semiconductor substrate 81 with the intervention of a silicon oxide film 82. A peripheral portion of the Al electrode 83 is covered with a passivation film 84 such as of SiN or PSG. An impurity 77 of a predetermined conductivity type has been implanted at a high concentration in a peripheral region (e.g., a scribe line region) of the semiconductor substrate 81 on which a stress relieving bump is to be formed, to allow for ohmic contact or insulation. The impurity has the same conductivity type as the substrate for the ohmic contact between the bump and the substrate, and has a different conductivity type from the substrate for the insulation of the bump from the substrate. A metal layer such as of Al may be provided on the peripheral region by vapor deposition.

Figure 1B:
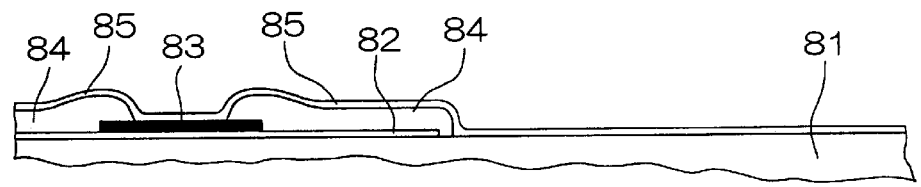

A seed layer 85 which comprises a TiW alloy layer for improvement of adhesion of bumps to the Al electrode and a metal layer such as of Au or Pt for power supply is formed on the resulting semiconductor substrate 81 by vapor deposition such as sputtering (FIG. 1B).

Figure 1C:
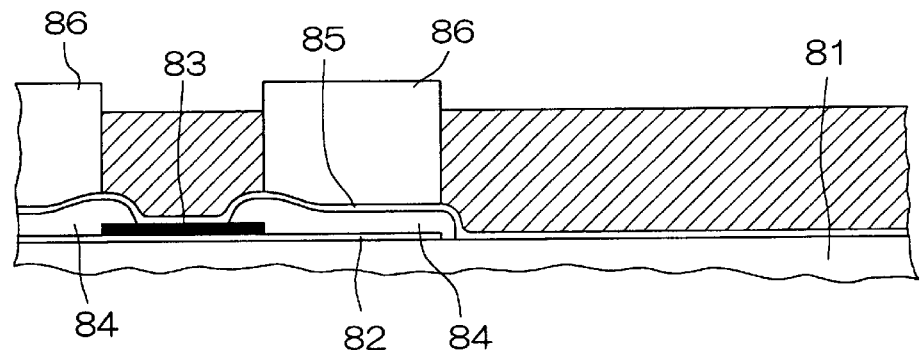

In turn, a photoresist 86 is applied on the resulting substrate, and openings for plating for bump formation are formed in the photoresist layer in positions where an electrode and the stress relieving bump are to be formed (FIG. 1C).

Figure 1D:
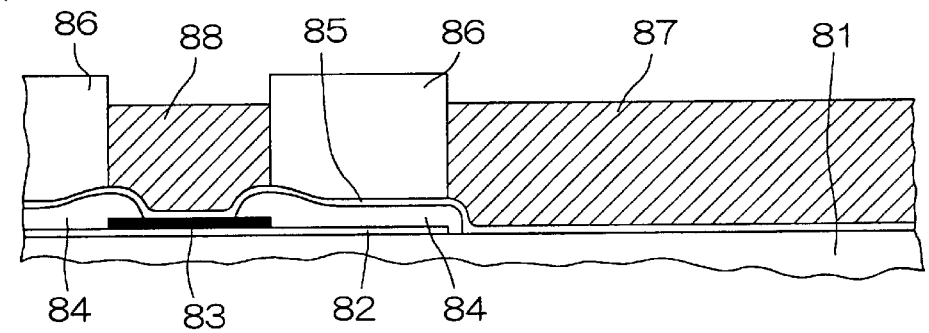

Then, a metal bump material is thickly deposited on the resulting substrate by electroplating (FIG. 1D). Examples of the metal bump material include oxidation-resistant metals such as Au, Pd, Pt, Ag and Ir (iridium). Of the bumps thus formed, the bump formed on the Al electrode 83 is denoted by a reference numeral 88, and the stress relieving bump is denoted by a reference numeral 87.

Figure 1E:
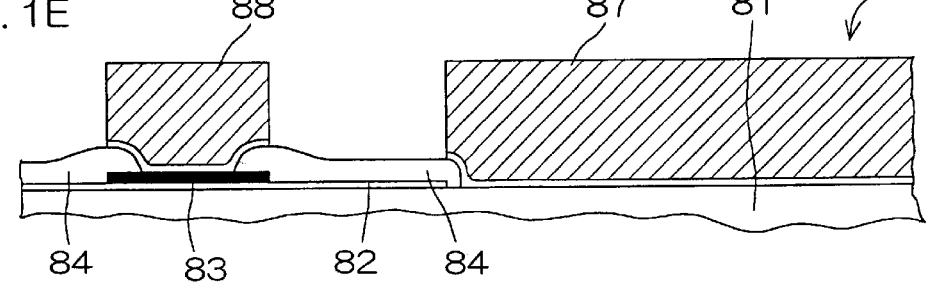

Subsequently, the photoresist 86 is removed, and then a portion of the seed layer 85 exposed on the surface is removed (FIG. 1E). Thus, the semiconductor chip 80 is provided.

Figure 2A:
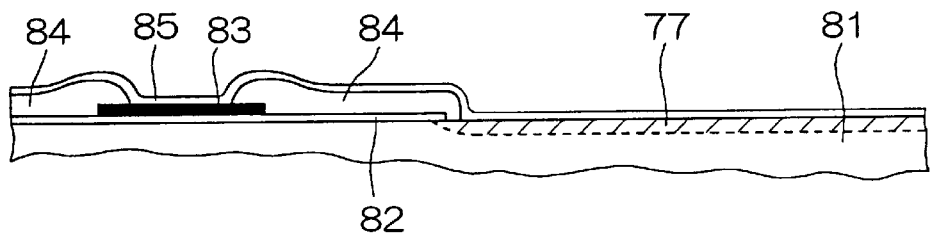
FIGS. 2A and 2B are sectional views for explaining a production process to be performed when an electroless plating is employed for the bump formation.
Figure 2B:
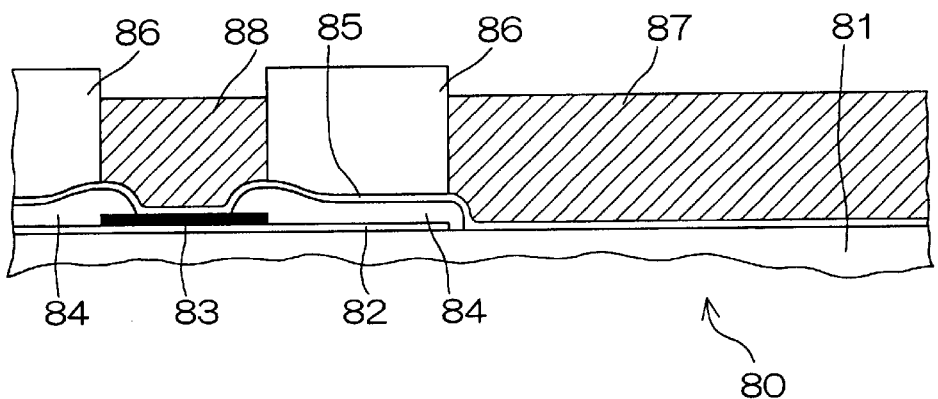

FIGS. 2A and 2B are sectional views for explaining a production process to be performed when an electroless plating which is a metal film formation method utilizing a reducing action of a chemical reaction is employed for the bump formation.

As shown in FIG. 2A, an Al electrode 83 is formed in a predetermined position on a device formation region (active region) of an Si-based semiconductor substrate 81 with the intervention of a silicon oxide film 82, and the device formation region except a portion thereof formed with the Al electrode 83 is covered with a passivation film 84. An impurity 77 of a predetermined conductivity type has been implanted at a high concentration in a region of the semiconductor substrate on which a stress relieving bump is to be formed, to allow for ohmic contact or insulation as in the step shown in FIG. 1A. Then, a seed film 85 is formed on the surface of the resulting substrate.

In turn, a photoresist 86 is applied on the resulting substrate, and openings are formed in predetermined positions in the photoresist layer. Then, a metal bump material is deposited on the resulting substrate by electroless plating (FIG. 2B). Thereafter, the photoresist 86 is removed, and a portion of the seed layer 85 exposed on the surface is removed. Thus, the semiconductor chip 80 is provided.

Figure 3A:
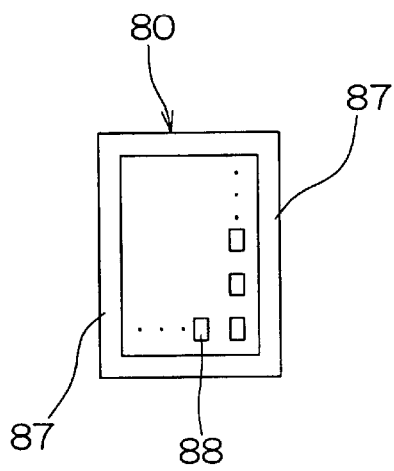
FIGS. 3A and 3B are a plan view and a perspective view, respectively, of a semiconductor chip having a stress relieving bump provided on the periphery thereof.
Figure 3B:
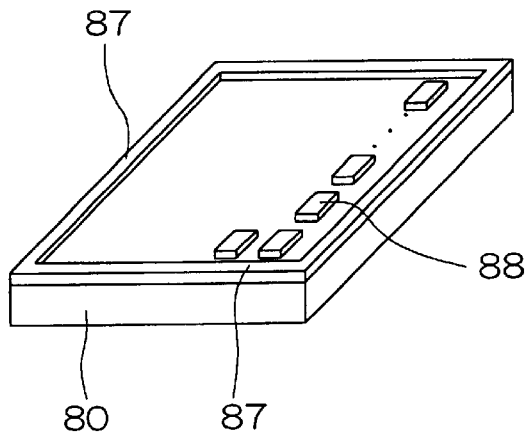

In the semiconductor chip 80 fabricated through the method illustrated in FIGS. 1A to 1E or FIGS. 2A and 2B bumps (hereinafter referred to as "inner bumps") 88 are formed on an upper surface thereof, and a bump (hereinafter referred to as "peripheral bump") 87 is formed in a peripheral region thereof, as shown in FIGS. 3A and 3B.

Figure 4A:
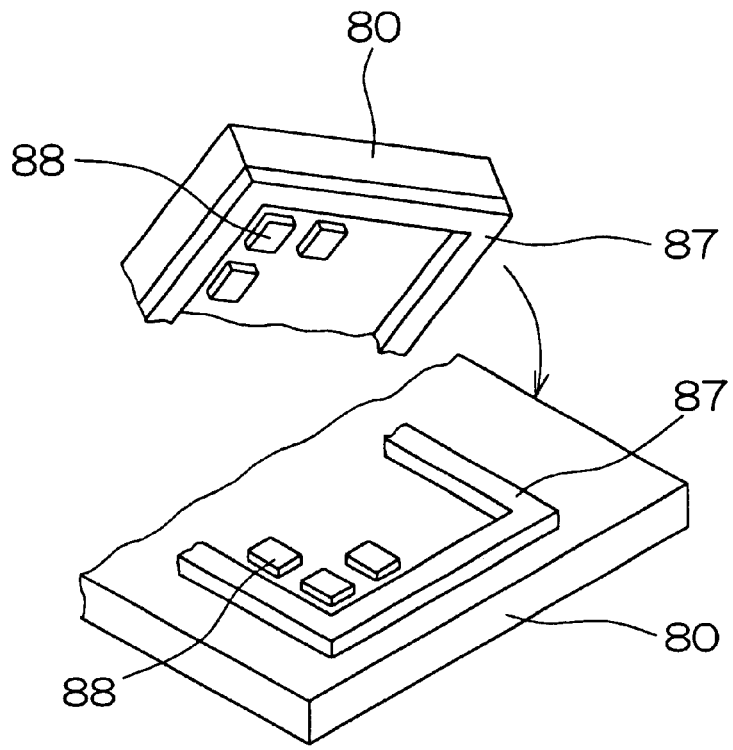
FIGS. 4A and 4B are diagrams for explaining how semiconductor chips each having a peripheral bump are stacked to form a so-called chip-on-chip double-stacked structure.
Figure 4B:
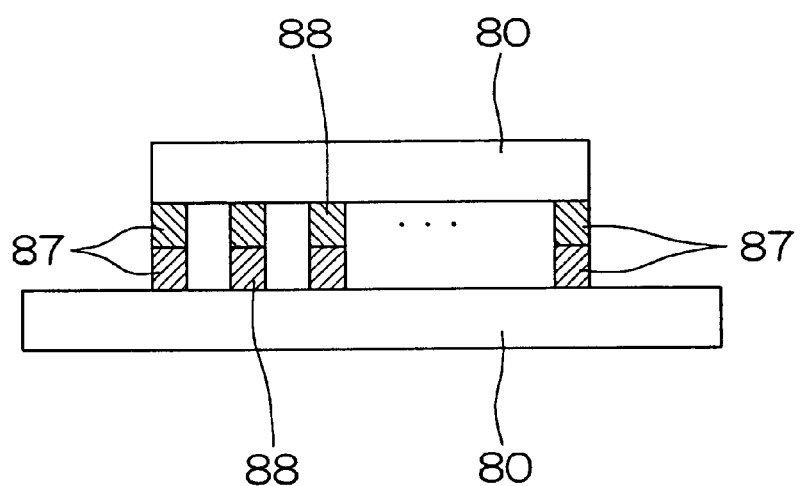

FIGS. 4A and 4B are diagrams for explaining how semiconductor chips 80 each having a peripheral bump 87 are stacked to form a so-called chip-on-chip double-stacked structure. Particularly, FIG. 4A is a perspective view illustrating the semiconductor chips 80 yet to be bonded, and FIG. 4B is a sectional view illustrating the semiconductor chips bonded to each other. The semiconductor chips 80, 80 to be stacked generally have substantially the same surface structure, but have different internal circuit structures and functions.

When the opposed inner bumps 88 are bonded to each other, the opposed peripheral bumps 87 each having a relatively large contact area are brought into contact with each other to relieve shocks exerted on the inner bumps 88, thereby preventing a contact failure. Further, the peripheral bumps relieve stresses exerted on the contacts of the inner bumps during use of the semiconductor device.

Where a TAB pattern film is used instead of either of the semiconductor chips 80 in FIGS. 4A and 4B, a similar stress relieving effect can be expected.

The stress relieving bump 87 entirely surrounds the semiconductor chip 80 as described above, but may partly surround the semiconductor chip 80. Alternatively, the stress relieving bump may be provided on an inward surface portion of the semiconductor chip 80.

Figure 5:
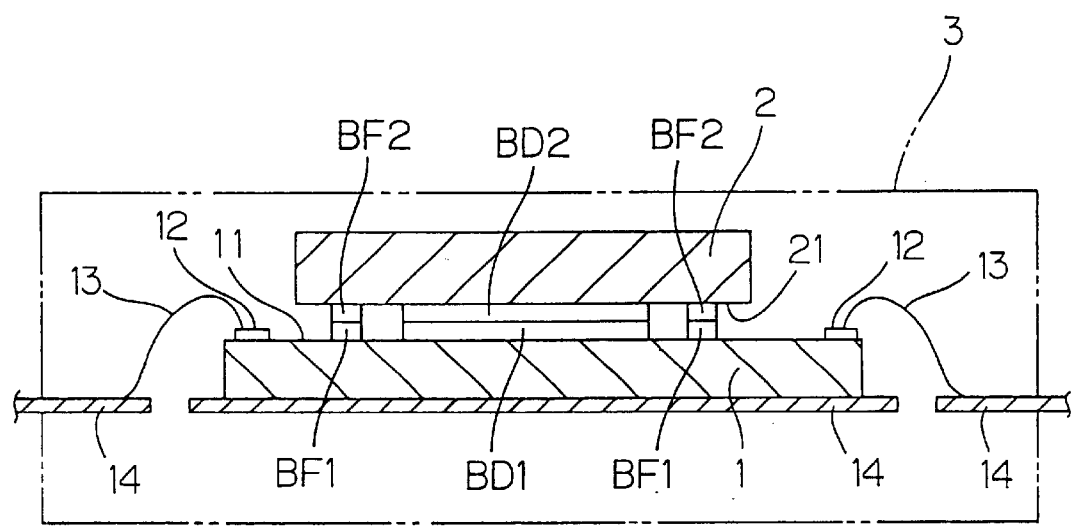
FIG. 5 is a schematic sectional view illustrating the construction of a semiconductor device according to a second embodiment of the invention.

FIG. 5 is a schematic sectional view illustrating the construction of a semiconductor device which employs a semiconductor chip according to a second embodiment of the invention. The semiconductor device has a so-called chip-on-chip structure, and is produced by bonding a secondary chip 2 onto a front face 11 of a primary chip 1 in a stacked relation and packaging the stacked semiconductor chips in a resin-sealed package 3.

The primacy chip 1 and the secondary chip 2 are, for example, silicon chips. The front face 11 of the primary chip 1 is a surface of a semiconductor substrate, which serves as a base of the primary chip 1, on the side of an active surface region formed with a functional device such as a transistor. A plurality of pads 12 for external connection are provided in a peripheral region of the front face 11, and connected to a lead frame 14 via bonding wires 13. A plurality of functional bumps BF1 for electrical connection to the secondary chip 2 and a dummy bump BD1 isolated from an internal circuit are provided on the front face 11 of the primary chip 1.

The secondary chip 2 is bonded to the primary chip 1 with a front face 21 thereof opposed to the front face 11 of the primary chip 1 by a so-called face-down method. The front face 21 of the secondary chip 2 is a surface of a semiconductor substrate, which serves as a base of the secondary chip 2, on the side of an active surface region formed with a functional device such as a transistor. A plurality of functional bumps BF2 connected an internal circuit and a dummy bump BD2 isolated from the internal circuit are provided on the front face 21 of the secondary chip 2 in an opposed relation to the functional bumps BF1 and the dummy bump BD1, respectively, of the primary chip 1,.

Figure 6:
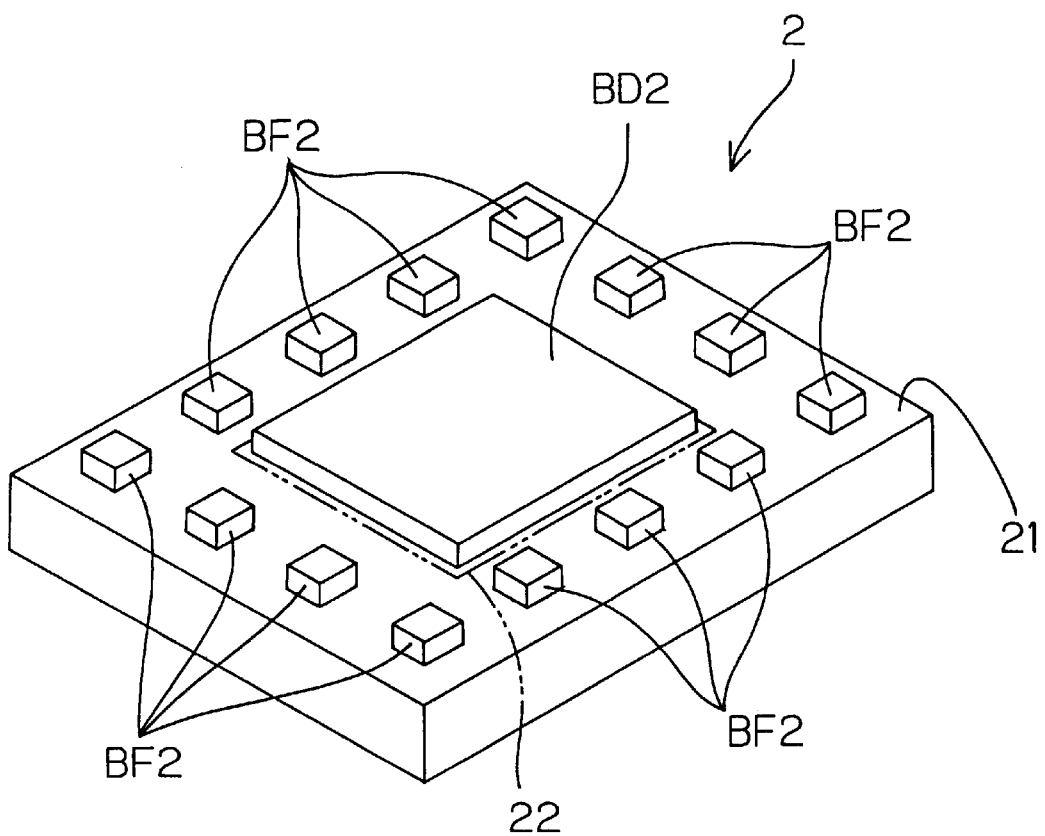
FIG. 6 is an enlarged perspective view illustrating one exemplary construction of a secondary chip employed in the second embodiment.

FIG. 6 is an enlarged perspective view illustrating the construction of the secondary chip 2. Since the functional bumps BF1 and dummy bump BD1 of the primary chip 1 have substantially the same construction as the functional bumps BF2 and dummy bump BD2 of the secondary chip 2, an explanation will hereinafter be given only to the secondary chip 2, and no explanation will be given to the primary chip 1.

The secondary chip 2 has a generally rectangular plan shape, and the active region 22 formed with the functional device is provided in a central portion of the secondary chip as viewed in plan. The plurality of functional bumps BF2 of a rectangular column shape (14 functional bumps in this embodiment) are provided along the periphery of the front face 21 as surrounding the active region 22. The single dummy bump BD2, for example, having a rectangular plan shape is disposed on the active region 22. The dummy bump BD2 has a plan size such as to virtually entirely cover the active region 22, and the top surface area thereof (contact area in contact with the dummy bump BD1 of the primary chip 1) is greater than the top surface area of each of the functional bumps BF2 (contact area in contact with the functional bump BF1 of the primary chip 1). The dummy bump BD2 has substantially the same height as the functional bumps BF2.

The bonding of the secondary chip 2 to the primary chip 1 is achieved by mounting the secondary chip 2 onto the primary chip 1 with the front face 21 of the secondary chip 2 opposed to a predetermined portion of the front face 11 of the primary chip 1, and press-bonding the primary and secondary chips 1, 2 to each other. At this time, the functional bumps BF2 and dummy bump BD2 of the secondary chip 2 are bonded to the corresponding functional bumps BF1 and dummy bump BD1 of the primary chip 1. Thus, the peripheral portion of the secondary chip 2 is supported by the functional bumps BF1 and BF2, while the central portion of the secondary chip 2 is supported by the dummy bumps BD1, BD2 each having a relatively large contact area.

Electrical connection between the primary chip 1 and the secondary chip 2 is established by the connection between the functional bumps BF1 and the functional bumps BF2, so that the dummy bump BD1 and the dummy bump BD2 do not serve for the electrical connection between the primary chip 1 and the secondary chip 2.

In accordance with this embodiment, the central portions of the primary chip 1 and the secondary chip 2 are supported by the dummy bumps BD1, BD2 each having a relatively large contact area as described above, so that deformation of the primary and secondary chips 1, 2 can be prevented which may otherwise occur due to stress-strains at resin sealing. Thus, deterioration of device characteristics due to such deformation can be prevented.

Although the single dummy bump BD2 (dummy bump BD1) having a generally rectangular plan shape is provided on the front face 21 of the secondary chip 2 (on the front face 11 of the primary chip 1) in this embodiment, the shape and number of dummy bumps BD2 (dummy bumps BD1) may be determined as desired, as long as the dummy dump has a greater contact area than the functional bumps BF2 (functional bumps BF1).

Figure 7:
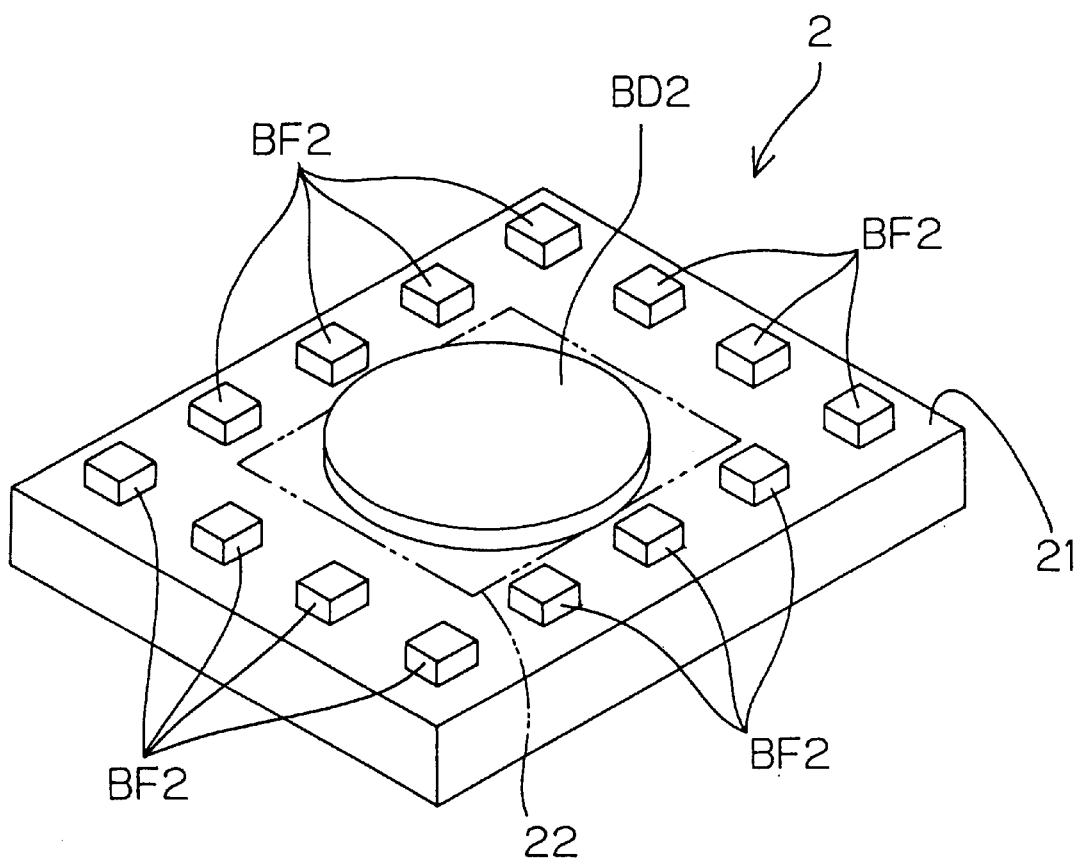
FIG. 7 is a perspective view for explaining another exemplary construction of the secondary chip.
Figure 8:
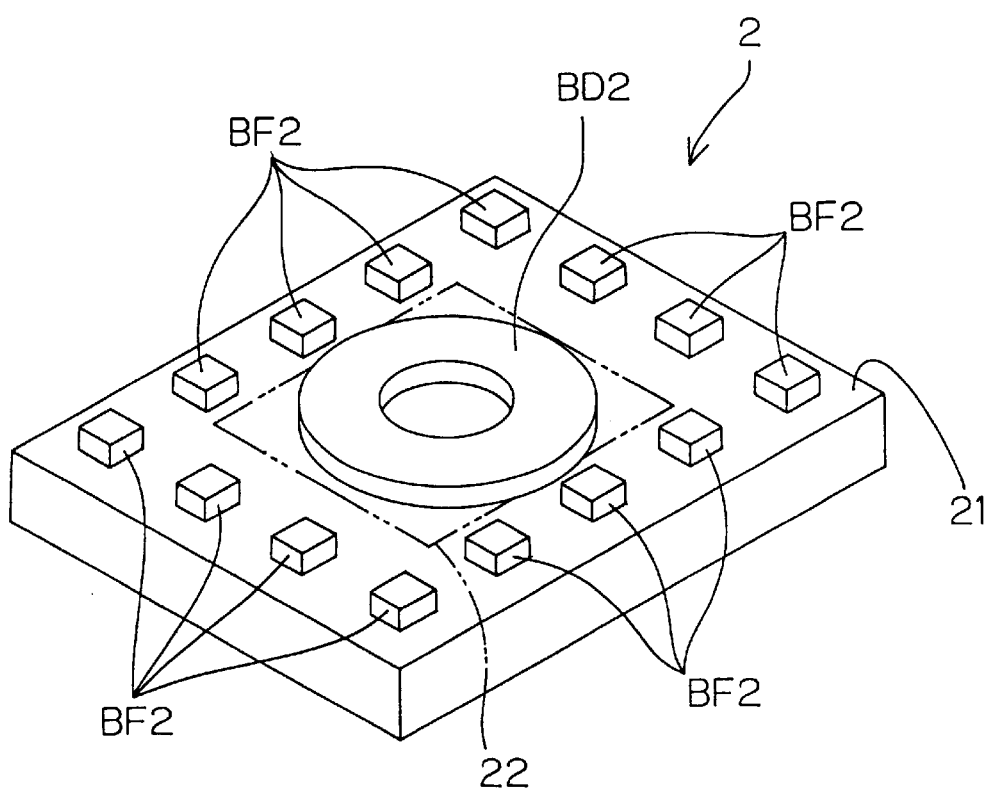
FIG. 8 is a perspective view for explaining further another exemplary construction of the secondary chip.
Figure 9:
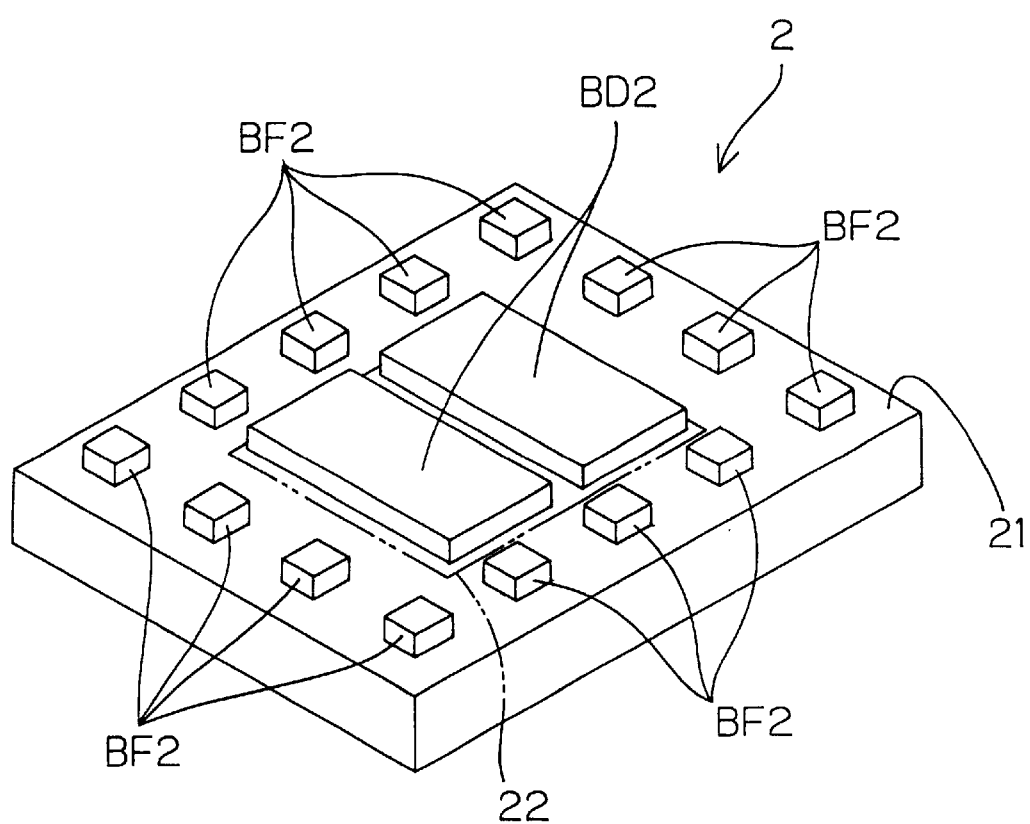
FIG. 9 is a perspective view for explaining still another exemplary construction of the secondary chip.

For example, the dummy bump BD2 (dummy bump BD1) may have a generally circular plan shape as shown in FIG. 7, or may have a generally donut-like plan shape as shown in FIG. 8. Alternatively, two dummy bumps BD2 (dummy bumps BD1) may be provided on the front face 21 of the secondary chip 2 (on the front face 11 of the primary chip 1) as shown in FIG. 9. Further, three or more dummy bumps BD2 (dummy bumps BD1) may be provided on the front face 21 of the secondary chip 2 (on the front face 11 of the primary chip 1).

The dummy bumps BD1, BD2 are preferably connected to a low impedance portion such as the ground or a source line which has a stable potential. Thus, the dummy bumps BD1, BD2 are each preventing from serving as an antenna, thereby preventing external noises from being introduced into the primary chip 1 and secondary chip 2. Therefore, the semiconductor device exhibits more stable device characteristics.

Although the primary chip and the secondary chip are each provided with the functional bumps and the dummy bump in the aforesaid embodiment, either one of the primary chip and the secondary chip may be provided with the functional bumps and the dummy bump, and the chip-on-chip bonding may be achieved by connecting these bumps to the front face of the other chip. Further, either one of the primary chip and the secondary chip may be provided with the functional bumps, and the other chip may be provided with the dummy bump.

Figure 10:
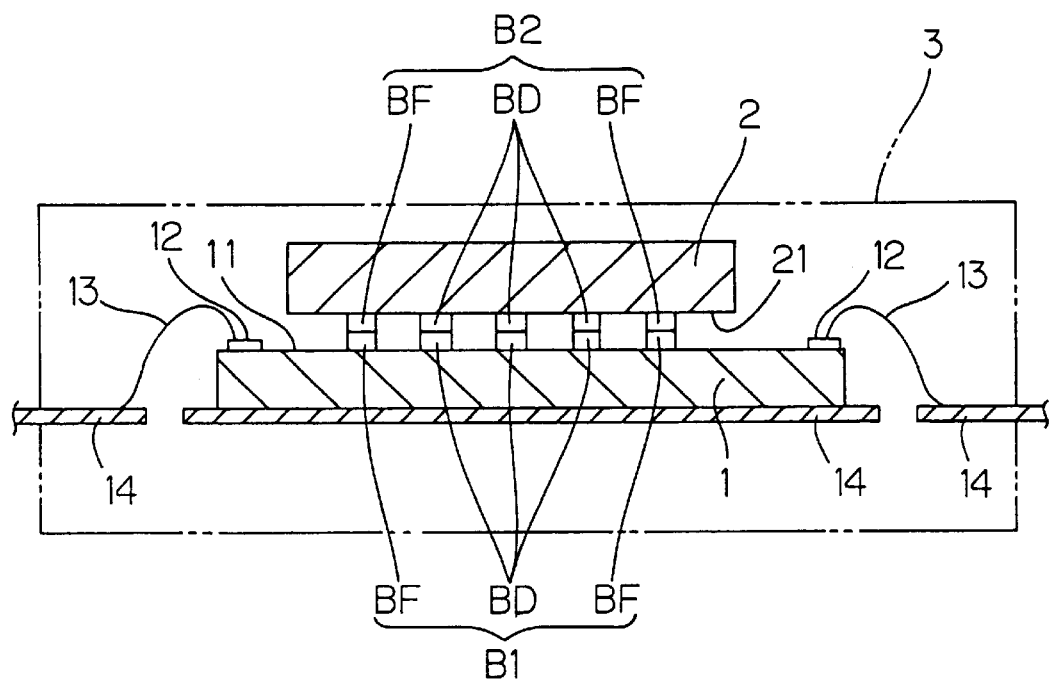
FIG. 10 is a schematic sectional view illustrating the construction of a semiconductor device according to a third embodiment of the invention.

FIG. 10 is a schematic sectional view illustrating the construction of a semiconductor device according to a third embodiment of the invention. In FIG. 10, portions corresponding to those illustrated in FIG. 5 are denoted by the same reference characters as in FIG. 5. However, it is not intended that the portions denoted by the same reference characters in FIGS. 5 and 10 have identical constructions and functions.

The semiconductor device also has a chip-on-chip structure. That is, a secondary chip 2 is bonded to a primary chip 1 with a front face 21 thereof opposed to a front face 11 of the primary chip 11 by a so-called face-down method, and supported by a plurality of bumps provided therebetween. More specifically, a plurality of secondary bumps B2 are provided on the front face 21 of the secondary chip 2 as projecting therefrom, and a plurality of primary bumps B1 are provided on the front face 11 of the primary chip 1 in association with the secondary bumps B2 as projecting therefrom. The secondary bumps B2 are connected to the corresponding primary bumps B1, whereby the secondary chip 2 is supported on the primary chip 1.

The secondary bumps B2 include functional bumps BF connected to an internal interconnection of the secondary chip 2, and dummy bumps BD isolated from the internal interconnection of the secondary chip 2. On the other hand, the primary bumps B1 include functional bumps BF connected to an internal interconnection of the primary chip 1, and dummy bumps BD isolated from the internal interconnection of the primary chip 1. The functional bumps BF of the primary chip 1 are provided in an opposed relation to the functional bumps BF of the secondary chip 2 and the opposed functional bumps BF are connected to each other, whereby the internal interconnection of the primary chip 1 is electrically connected to the internal interconnection of the secondary chip 2. The dummy bumps BD of the primary chip 1 are provided in an opposed relation to the dummy bumps BD of the secondary chip 2, and the connection between the opposed dummy bumps BD is irrelevant to the electrical connection between the internal interconnection of the primary chip 1 and the internal interconnection of the secondary chip 2.

Figure 11:
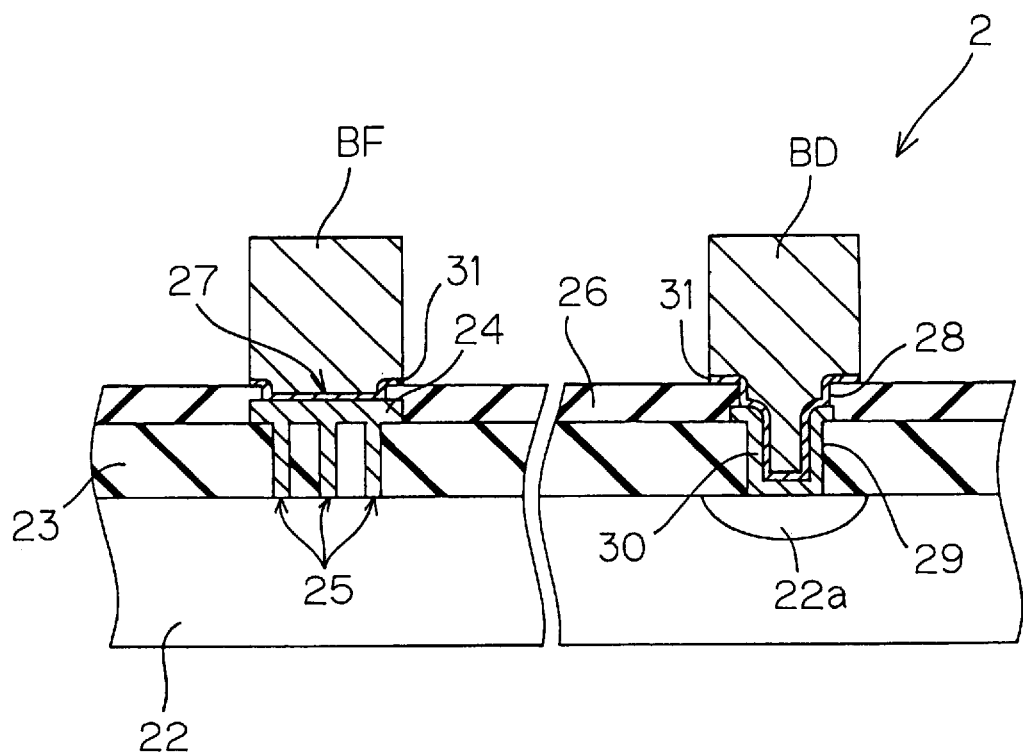
FIG. 11 is an enlarged sectional view illustrating the construction of a secondary chip employed in the third embodiment.

FIG. 11 is an enlarged sectional view illustrating the construction of the secondary chip 2. A silicon oxide film 23 is provided on a semiconductor substrate 22 of the secondary chip 2, and an interconnection 24 such as of aluminum is provided on the silicon oxide film 23. The interconnection 24 is connected to the semiconductor substrate 22 via a plurality of contact holes 25 formed in the silicon oxide film 23. The silicon oxide film 23 and the interconnection 24 are covered with a surface protective film 26, and a functional bump BF of an oxidation-resistant metal (e.g., gold, lead, platinum, silver or iridium) is provided on an opening 27 formed in the surface protective film 26.

On the other hand, a dummy bump BD is provided on the surface protective film 26 as projecting therefrom, and connected to the semiconductor substrate 22 via an opening 28 formed in the surface protective film 26 and a contact hole 29 formed in the silicon oxide film 23.

The functional bump BF and the dummy bump BD are formed on the semiconductor substrate 22 in a wafer form. The dummy bump BD and the functional bump BF are formed of the same material in the same process step. More specifically, in the step of forming the contact holes 25 in the silicon oxide film 23, the formation of the contact hole 29 is carried out simultaneously with the formation of the contact holes 25. In the step of forming the interconnection 24 on the silicon oxide film 23 formed with the contact holes 25, 29, a metal film 30 is formed of the same material as the interconnection 24 in the contact hole 29. Thereafter, the surface protective film 26 is formed on the silicon oxide film 23, and the openings 27, 28 are formed in the surface protective film 26 in association with the interconnection 24 and the metal film 30. In turn, a seed film 31 is formed on the surface of the surface protective film 26 formed with the openings 27, 28 and, after a resist film is formed on the seed film 31 except portions thereof formed with the openings 27, 28, the resulting substrate is subjected to plating with the use of the material for the functional bump BF and the dummy bump BD. Then, the resist film on the seed film 27 is removed, and a portion of the seed film 27 exposed as a result of the removal of the resist film is removed. Thus, the dummy bump BD connected to the semiconductor substrate 22 via the opening 28 and the contact hole 29 are provided along with the functional bump BF.

Where the functional bump BF and the dummy bump BD are composed of Au (gold), for example, the formation of the seed film 31 may be achieved by forming a TiW (titanium tungsten) film on the surface protective film 26 by sputtering and then depositing Au on the TiW film by sputtering.

A region 22a of the semiconductor substrate 22 which faces the contact hole 29 has been subjected to a resistance reducing process for reducing the resistance of this region. The resistance reducing process may be an ion implantation process for implanting impurity ions into the region 22a. In this case, the ion implantation process can be performed simultaneously with formation of source/drain regions of a functional device such as a transistor.

The resistance reducing process may be achieved by diffusing the impurity into the region 22a of the semiconductor substrate 22 via the opening formed in the silicon oxide film 23 before the impurity is diffused into the silicon oxide film 23 for reducing the resistance of the silicon oxide film 23.

Alternatively, the resistance reducing process may be a so-called salicide process. In the salicide process, a portion of the silicon oxide film 23 opposed to the region 22a is removed, and then titanium is deposited over the entire surface of the silicon oxide film by sputtering. In turn, the resulting substrate is subjected twice to a thermal process, for example, at about 800°C. for reaction of titanium with silicon in the region 22a, and then unreacted titanium is removed with the use of aqueous ammonia. Thus, silicon in the region 22a is reacted with titanium into a silicide, so that the resistance of the region 22a is reduced.

In accordance with this embodiment, the semiconductor device includes the dummy bump BF which does not serve for the electrical connection between the primary chip 1 and the secondary chip 2 in addition to the functional bump BF for the electrical connection between the primary chip 1 and the secondary chip 1 as described above. Therefore, a force exerted on the primary chip 1 or the secondary chip 2 at the resin sealing can be distributed over the chip, so that deformation of the primary chip 1 or the secondary chip 2 can be prevented which may otherwise be caused by mechanical pressures applied thereto or stress-strains occurring therein. This prevents deterioration of device characteristics due to the deformation of the primary chip 1 or the secondary chip 2.

Since the dummy bump BD is connected to the semiconductor substrate 22 which is a low impedance portion with a stable potential, there is no possibility that external noises are introduced into the semiconductor device via the dummy bump BD. Therefore, the functional devices in the primary chip 1 and the secondary chip 2 exhibit stable device characteristics.

Where the region 22*a* of the semiconductor substrate 22 connected to the dummy bump BD has been subjected to the resistance reducing process, the possibility that external noises are introduced via the dummy bump BD can further be reduced thereby to ensure more stable device characteristics.

Although the dummy bump BD of the secondary chip 2 is connected to the semiconductor substrate 22 (low impedance portion) in this embodiment, the dummy bump BD of the primary chip 1 may be connected to a low impedance portion. Further, the dummy bumps BD of both the primary chip 1 and the secondary chip 2 may be connected to the low impedance portions.

Although the primary chip 1 and the secondary chip 2 are respectively provided with the primary bumps B1 and the secondary bumps B2, the bumps may be provided on either one of the primary chip 1 and the secondary chip 2 so that the chip-on-chip bonding is achieved by connecting the bumps to the surface of the other chip. Alternatively, either the primary bumps B1 or the secondary bumps B2 may be replaced with metal pads each having a smaller height than the bumps.

The functional bump BF land the dummy bump BD are composed of the same material, but may be composed of different materials. In this case, the dummy bump BD and the functional bump BF are formed in different process steps.

Figure 12:
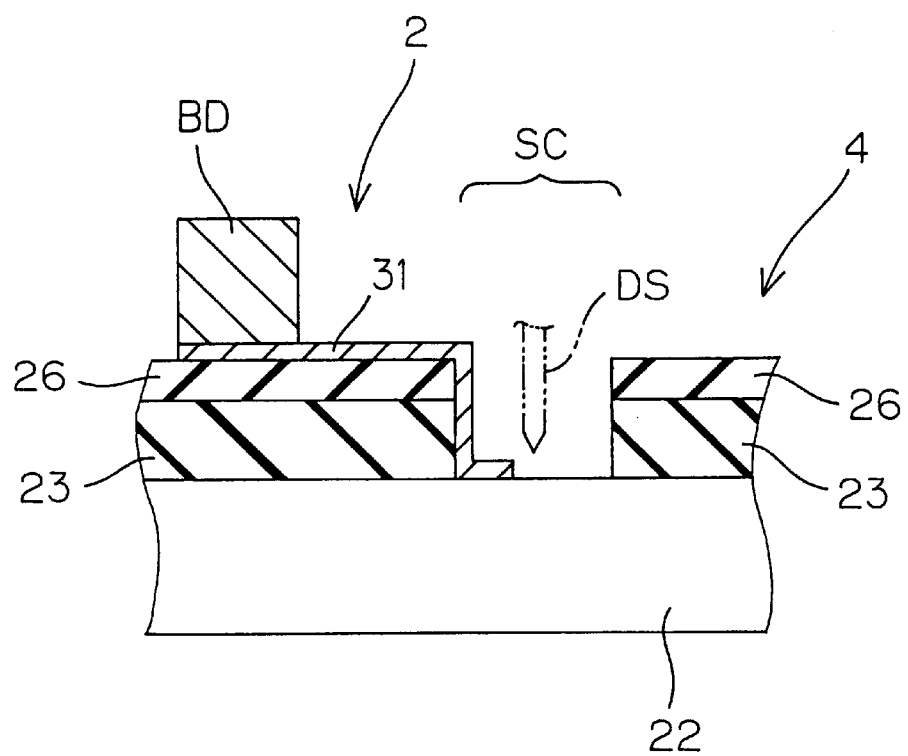
FIG. 12 is a sectional view for explaining a fourth embodiment of the invention.

FIG. 12 is a sectional view for explaining a fourth embodiment of the invention. In FIG. 12, portions corresponding to those illustrated in FIG. 11 are denoted by the same reference characters as in FIG. 11, and no explanation will be given thereto.

In this embodiment, a material for a dummy bump BD is deposited on a seed film 31 by plating, and then a portion of the seed film 31 not contacting the dummy bump BD is not entirely removed but selectively allowed to remain. The dummy bump BD is connected via the remaining seed film portion 31 (interconnection) to a scribe line region SC provided between the secondary chip 2 and an adjacent chip 4 on a wafer.

The scribe line region SC is a region along which the semiconductor substrate 22 in a wafer form is cut into chips by means of a dicing saw DS. The scribed region SC is free of the silicon oxide film 23 and the surface protective film 26, so that the semiconductor substrate 22 is exposed in the scribed line region SC. Therefore, the dummy bump BD can be connected to the semiconductor substrate 22 as the low impedance portion by allowing the seed film 31 to partly remain for connection between the scribe line region SC and the dummy bump BD. Thus, the semiconductor device incorporating the secondary chip 2 exhibits stable device characteristics because there is no possibility that external noises are introduced via the dummy bump BD.

FIGS. 13A to 13E are sectional views illustrating a fifth embodiment of the invention. Since a semiconductor device according to this embodiment has the same construction as the semiconductor device shown in FIG. 10, a reference is again made to FIG. 10, and an overlapped explanation will not be given thereto.

FIGS. 13A to 13E illustrate the constructions of a functional bump BF and a dummy bump BD of a primary chip 1 and a bump formation process. An inter-level insulating film 15 such as of silicon oxide is provided on a semiconductor substrate (not shown) which serves as a base of the primary chip 1, and an internal interconnection 16 is provided on the inter-level insulating film 15. The inter-level insulating film 15 and the internal interconnection 16 are covered with a surface protective film 17, and a functional bump BF of an oxidation-resistant metal (e.g., gold, platinum, silver, palladium or iridium) is provided as an electric connection portion on an opening 18 formed in the surface protective film 17. A dummy bump BD of the same material as the functional bump BF is provided as a dummy connection portion on the surface protective film 17.

The functional bump BF and the dummy bump BD have substantially the same height and, therefore, can simultaneously be formed in a production process. More specifically, the surface protective film 17 is formed, for example, of silicon nitride on the inter-level insulating film 15 formed with the internal interconnection 16 as shown in FIG. 13A. The surface protective film 17 has a greater thickness than the internal interconnection 16.

In turn, the resulting substrate is subjected to an HDP process, whereby the surface of the surface protective film 17 is planarized as shown in FIG. 13B. Thereafter, an opening 18 is formed in a region of the surface protective film 17 opposed to the internal interconnection 16 by the photolithography technology, as shown in FIG. 13C, for exposing a surface portion of the internal interconnection 16.

Subsequently, a seed film not shown is formed on the surface protective film 17 formed with the opening 18. Where the functional bump BF and the dummy bump BD are composed of Au (gold), for example, the formation of the seed film may be achieved by forming a TiW (titanium tungsten) film on the surface protective film 17 by sputtering, and then depositing Au on the TiW film by sputtering.

In turn, a resist pattern 19 is selectively formed on the seed film by the photolithography technique as shown in FIG. 13D, and then the resulting substrate is subjected to plating with the use of a material for the functional bump BF and the dummy bump BD, whereby the plating material is deposited in the opening 18 and in a region of the seed film on which the dummy bump BD is to be formed. At this time, the plating material is virtually uniformly deposited on the opening 18 and on the dummy bump formation region. Since the surface of the surface protective film 17 is planarized by the HDP process, the plating material is deposited on the opening 18 and on the dummy bump formation region to substantially the same height at the completion of the plating.

After the completion of the plating, the resist pattern 19 on the seed film is removed, and a portion of the seed film exposed as a result of the removal of the resist pattern 19 is removed. Thus, the functional bump BF and the dummy bump BD which have substantially the same height with respect to the surface of the surface protective film 17 to the top surfaces thereof are formed as shown in FIG. 13E.

In accordance with this embodiment, the functional bump BF and the dummy bump BD which have substantially the same height can be provided by forming the surface protective film 17 with a greater thickness than the internal interconnection 16, then planarizing the surface of the surface protective film 17, and performing the selective plating for formation of the functional bump BF and the dummy bump BD. Therefore, when the primary chip 1 is bonded to a secondary chip 2 fabricated in the same manner as the primary chip 1, a functional bump BF and a dummy bump BD of the secondary chip 2 can properly be bonded to the functional bump BF and the dummy bump BD, respectively, of the primary chip 1. Thus, electrical connection between the primary chip 1 and the secondary chip 2 can assuredly be established and, in addition, stresses exerted on the primary chip 1 and the secondary chip 2 can advantageously be relieved.

Since the surface of the surface protective film 17 is planarized, the resist pattern 19 can properly be formed through patterning by the photolithography technique. Thus, the functional bump BF and the dummy bump BD can be formed in desired positions with a high level of precision.

Although the planarization of the surface of the surface protective film 17 is achieved through the planarization process, the formation of the surface protective film 17 with a substantially flat surface on the inter-level insulating film 15 can be achieved by depositing a material for the surface protective film 17 through a high density plasma CVD (chemical vapor deposition) method.

FIGS. 14A to 14D are sectional views illustrating the construction of a major portion of a semiconductor chip and a production process therefor in accordance with a sixth embodiment of the invention. In FIGS. 14A to 14D, portions corresponding to those illustrated in FIGS. 13A to 13E are denoted by the same reference characters as in FIGS. 13A to 13E, and an explanation will hereinafter be given mainly to differences between the fifth and sixth embodiments.

The semiconductor chip 4 according to the sixth embodiment can be employed, for example, in place of the primary chip 1 of the fifth embodiment. A dummy bump BD as a dummy connection portion and a surface interconnection 41 as an electrical connection portion connected to an internal interconnection 16 are provided on a surface protective film 17 of the semiconductor chip. In this embodiment, the surface interconnection 41 and the dummy bump BD provided on the surface protective film 17 are respectively bonded to a functional bump BF and a dummy bump BD of a secondary chip 2, whereby chip-on-chip bonding between the semiconductor chip 4 and the secondary chip 2 is achieved.

The surface interconnection 41 and the dummy bump BD are composed of the same material, and simultaneously formed in the production process. More specifically, the surface protective film 17 is formed on an inter-level insulating film 15 formed with the internal interconnection 16 as shown in FIG. 14A, and then the surface of the surface protective film 17 is planarized through a CMP (chemical mechanical polishing) process. The CMP process is performed until the surface (upper surface) of the internal interconnection 16 is entirely exposed and the exposed surface of the internal interconnection 16 is planarized as shown in FIG. 14B. Thus, the surface (exposed surface) of the internal interconnection 16 and the surface of the surface protective film 17 become substantially flush with each other.

Thereafter, a seed film (not shown) is formed on the planarized surfaces of the internal interconnection 16 and the surface protective film 17, and a resist pattern 19 is formed on the seed film except a region thereof opposed to the internal interconnection 16 and a region thereof where the dummy bump BD is to be formed, as shown in FIG. 14C, by the photolithography technique. Then, the resulting substrate is subjected to plating with the use of the material for the surface interconnection 41 and the dummy bump BD.

Thus, the plating material is deposited to substantially the same height on the region opposed to the internal interconnection 16 and on the dummy bump formation region. After the completion of the plating, the resist pattern 19 on the seed film is removed, and the portion of the seed film exposed as a result of the removal of the resist pattern 19 is removed, whereby the surface interconnection 41 and the dummy bump BD which have substantially the same height can be provided as shown in FIG. 14D.

In accordance with this embodiment, the surface protective film 17 is polished to expose the internal interconnection 16 and to allow the exposed surface of the internal interconnection 17 to be flush with the surface of the surface protective film 17, and then the selective plating is performed for formation of the surface interconnection 41 and the dummy dump BD. Thus, the surface interconnection 41 and the dummy bump BD which have substantially the same height H can be provided, and the same effect as provided in the fifth embodiment can be provided.

Since the surface of the internal interconnection 16 and the surface of the surface protective film 17 are substantially flush with each other, the surface interconnection 14 has a flat top surface without any projection and depression (see FIG. 13D) which may otherwise be formed due to steps between the internal interconnection 16 and the surface protective film 17. Thus, the surface interconnection 41 can properly be bonded to the functional bump BF of the secondary chip 2.

FIGS. 15A to 15E are sectional views illustrating the construction of a major portion of a semiconductor chip and a production process therefor in accordance with a seventh embodiment of the invention. In FIGS. 15A to 15E, portions corresponding to those illustrated in FIGS. 13A to 13E are denoted by the same reference characters as in FIGS. 13A to 13E, and an explanation will hereinafter be given mainly to differences between the fifth and seventh embodiments.

The semiconductor chip 5 according to the seventh embodiment can be employed, for example, in place of the primary chip 1 of the fifth embodiment. A functional pad 51 as an electrical connection portion connected to an internal interconnection 16 and a dummy pad 52 as a dummy connection portion isolated from an internal circuit are embedded in a surface protective film 17 of the semiconductor chip. In the seventh embodiment, the functional pad 51 and the dummy pad 52 provided on the surface protective film 17 are respectively bonded to a functional bump BF and a dummy bump BD of a secondary chip 2, whereby chip-on-chip bonding between the semiconductor chip 5 and a secondary chip 2 is achieved.

The functional pad 51 and the dummy pad 52 are composed of the same oxidation-resistant metal material (e.g., gold, platinum, silver, palladium or iridium), and simultaneously formed in the production process.

Figures 15A, 15B, 15C, 15D, 15E:
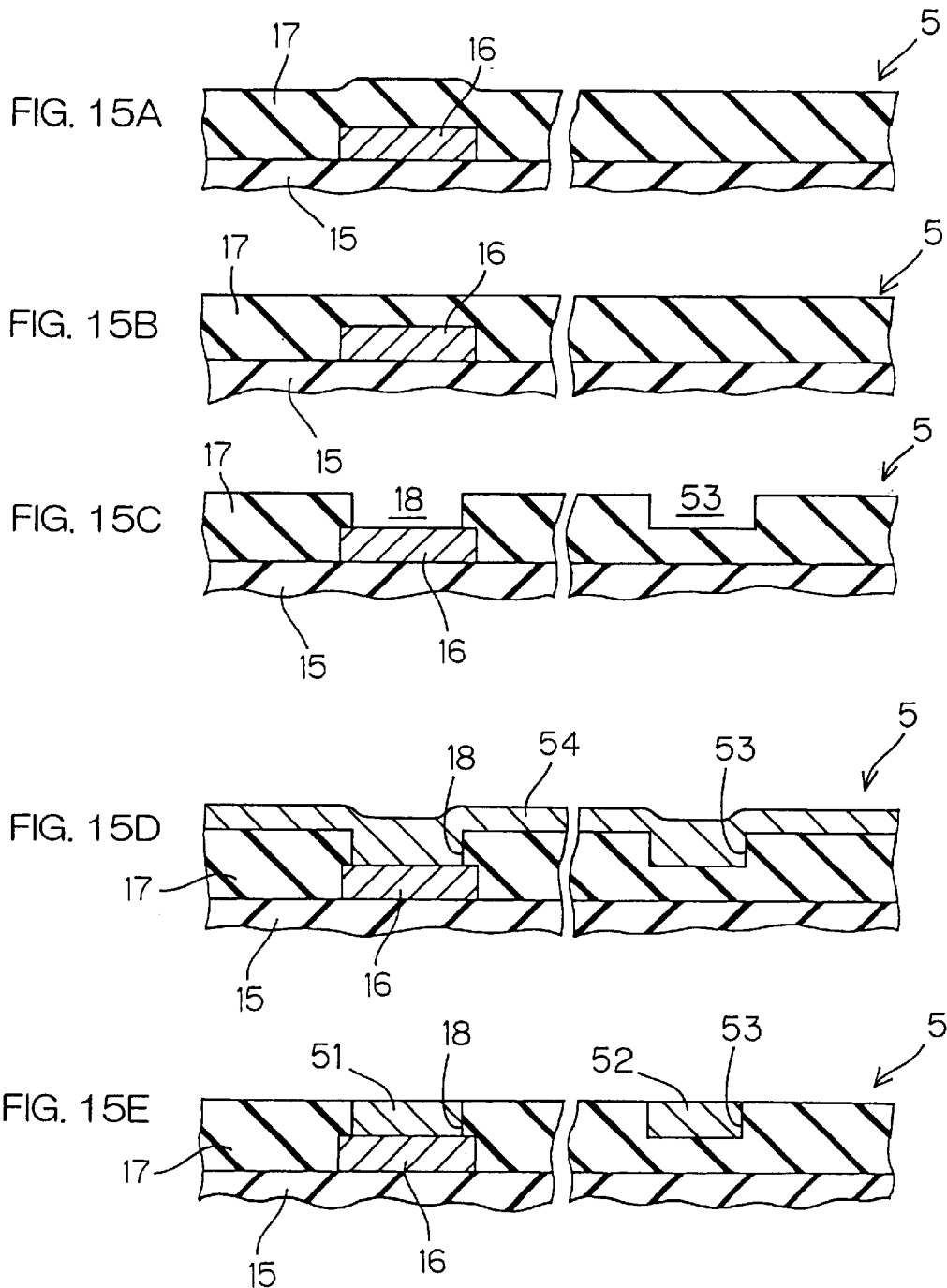
FIGS. 15A to 15E are sectional views illustrating the construction of a major portion of a semiconductor chip and a production process therefor in accordance with seventh embodiment of the invention.

For formation of the functional pad 51 and the dummy pad 52, the surface protective film 17 is formed, for example, of silicon nitride on an inter-level insulating film 15 formed with the internal interconnection 16 as shown in FIG. 15A. The surface protective film 17 has a greater thickness than the internal interconnection 16.

In turn, the surface of the surface protective film 17 is planarized through an HDP process as shown in FIG. 15B.

Thereafter, an opening 18 is formed in a region of the surface protective film 17 opposed to the internal interconnection 16 for exposing a surface portion of the internal interconnection 16, and a recess 53 is formed in a region of the surface protective film 17 where the dummy pad 52 is to be formed, as shown in FIG. 15C, by the photolithography technique.

Subsequently, a seed film (not shown) is formed on the surface protective film 17 formed with the opening 18 and the recess 53, and then the material for the functional pad 51 and the dummy pad 52 is deposited on the surface of the seed film by electroplating. The electroplating is performed until the opening 18 and the recess 53 are filled with the plating material as shown in FIG. 15D. Thus, a metal film 54 having a thickness greater than the depths of the opening 18 and the recess 53 is formed on the surface protective film 17.

Thereafter, the metal film 54 formed on the surface protective film 17 is chemically and physically polished through a CMP process. The CMP process is completed when the metal film 54 except portions thereof formed in the opening 18 and the recess 53 is removed as shown in FIG. 15E so that a surface 17a of the surface protective film 17 is exposed to be flush with the surfaces of the metal material (metal film 54) deposited in the opening 18 and the recess 53. Thus, the functional pad 51 and the dummy pad 52 each having a surface flush with the surface of the surface protective film 17 are formed in the opening 18 and the recess 53 formed in the surface protective film 17.

Therefore, when the secondary chip having the functional bump BF and the dummy bump BD is bonded to this primary chip 5, the functional bump BF and the dummy bump BD of the secondary chip 2 can properly be bonded to the functional pad 51 and the dummy pad 52, respectively. Thus, electrical connection between the primary chip 5 and the secondary chip can assuredly be established and, in addition, stresses exerted on the primary chip 5 and the secondary chip can advantageously be relieved.

Figure 16:
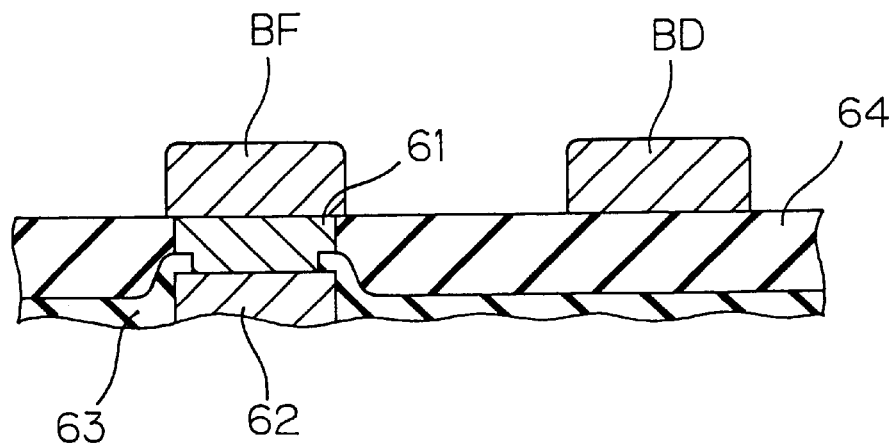
FIG. 16 is a sectional view for explaining one exemplary construction of a semiconductor chip of multi-level interconnection structure.
Figure 17:
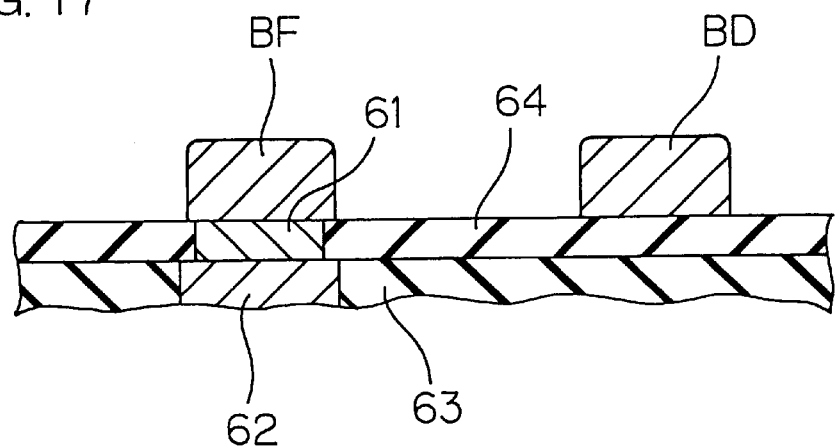
FIG. 17 is a sectional view for explaining another exemplary construction of the semiconductor chip of multi-level interconnection structure.

The embodiments shown in FIGS. 13A to 13E, 14A to 14D and 15A to 15E are applicable to a so-called multi-level interconnection structure, as shown in FIG. 16 or 17, in which a plurality of internal interconnections 61, 62 are disposed in a vertically stacked relation with the intervention of an inter-level insulating film 63. In this case, only the surface protective film 64 as the topmost layer may be planarized, or both the surface protective film 64 and the inter-level insulating film 63 provided therebelow may be planarized.

In the embodiment shown in FIGS. 13A to 13E, the electrical connection between the primary chip and the secondary chip is achieved by bonding the functional bump of the primary chip to the functional bump of the secondary chip. Alternatively, the electrical connection between the primary chip and the secondary chip may be achieved, for example, by providing on the surface protective film of the primary chip or the secondary chip a surface interconnection as an electrical connection portion connected to the internal interconnection via the opening formed in the surface protective film, and bonding the surface interconnection to the functional bump of the secondary chip or the primary chip. Further, the electrical connection between the primary chip and the secondary chip may be achieved by providing surface interconnections respectively on the primary chip and the secondary chip, and bonding the surface interconnections to each other.

Where the surface interconnection is provided as the electrical connection portion on the surface protective film, the surface protective film is formed as having a greater thickness than the internal interconnection on the inter-level insulating film formed with the internal interconnection, and then the surface of the surface protective film is planarized. Thereafter, an opening is formed in the planarized surface protective film, and a seed film is formed on the surface of the surface protective film formed with the opening by sputtering, followed by selective plating on a portion of the seed film opposed to the opening and a portion of the seed film on which the surface interconnection is to be formed. Thus, the surface interconnection is formed as extending from the opening onto the surface protective film. This provides for the following effects.

Figure 18:
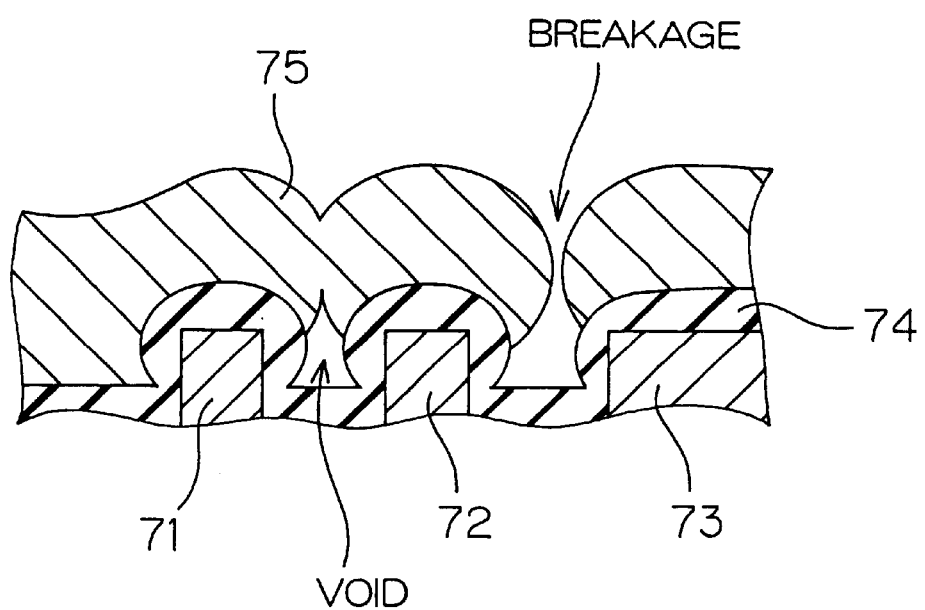
FIG. 18 is a sectional view for explaining an effect to be expected when the semiconductor production method according to the fifth embodiment is employed for formation of a surface interconnection.

In some case, as shown in FIG. 18, a surface protective film 74 formed over internal interconnections 71, 72, 73 has a mushroom-like cross section. If a seed film is formed on the surface of the surface protective film 74 by sputtering, the seed film does not properly adhere to portions of the surface protective film 74 between the internal interconnections 71 and 72 and between the internal interconnections 72 and 73. Therefore, if a surface interconnection 75 is formed on the seed film by selective plating, a plating material is not properly deposited on the afore said portions. This may result in voids occurring in gaps between the surface protective film 74 and the surface interconnection 75 and breakage of the surface interconnection 75. Where the surface interconnection is formed after the planarization of the surface protective film, on the contrary, the seed film can properly be formed over the surface of the surface protective film by vapor deposition. Therefore, there is no possibility of the occurrence of the voids and the breakage of the surface interconnection.

The semiconductor chip production methods according to the embodiments shown in FIGS. 14A to 14D and 15A to 15E are applied to the production of the primary chip, but is applicable to the production of the secondary chip.

Figure 19:
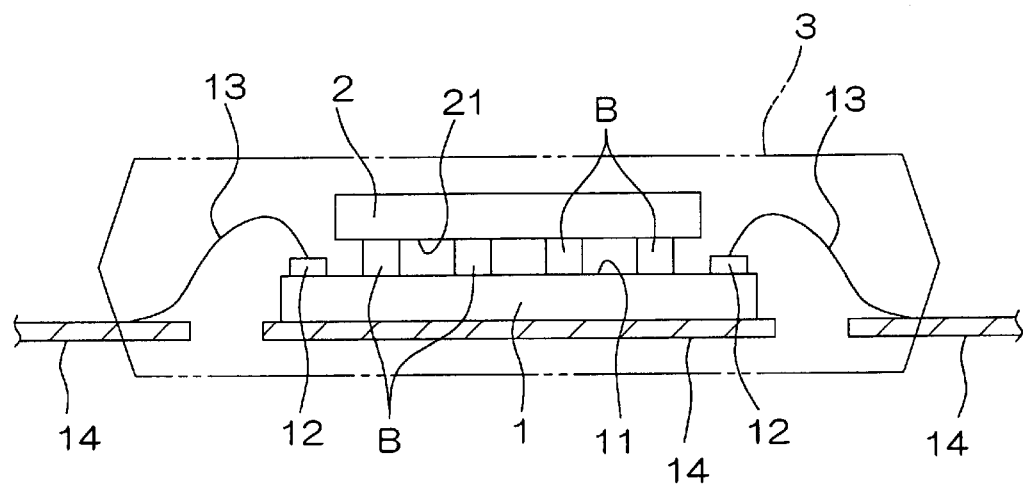
FIG. 19 is a schematic sectional view illustrating the construction of a semiconductor device according to an eighth embodiment of the invention.

FIG. 19 is a schematic sectional view illustrating the construction of a semiconductor device according to an eighth embodiment of the invention. In FIG. 19, portions corresponding to those illustrated in FIG. 5 are denoted by the same reference characters as in FIG. 5, and an overlapped explanation will be avoided as much as possible. However, it is not intended that the portions denoted by the same reference character have identical constructions and functions.

The semiconductor device also has a so-called chip-on-chip structure, and is fabricated by bonding a secondary chip 2 onto a front face 11 of a primary chip 1 in a stacked relation and packaging the stacked semiconductor chips in a resin-sealed package 3. The secondary chip 2 is bonded to the primary chip 1 with a front face 21 thereof opposed to the front face 11 of the primary chip 1 by a so-called face-down method, and supported by a plurality of bumps B provided between the primary chip 1 and the secondary chip 2.

The plurality of bumps B include functional bumps supporting the secondary chip 2 on the primary chip 1 and serving for electrical connection between the primary chip 1 and the secondary chip 2, and dummy bumps supporting the secondary chip 2 on the primary chip 1 but not serving for the electrical connection between the primary chip 1 and the secondary chip 2. The dummy bumps are provided in a region where the functional bumps are not provided to prevent the secondary chip 2 from being tilted on the primary chip 1. The provision of the dummy bumps relieves stresses which are exerted on the primary chip 1 and the secondary chip 2 by a sealing resin when these chips are resin-sealed in the package 3. Thus, deformation of the primary chip 1 and the secondary chip 2 can be prevented which may otherwise be caused by the stresses.

Figure 20:
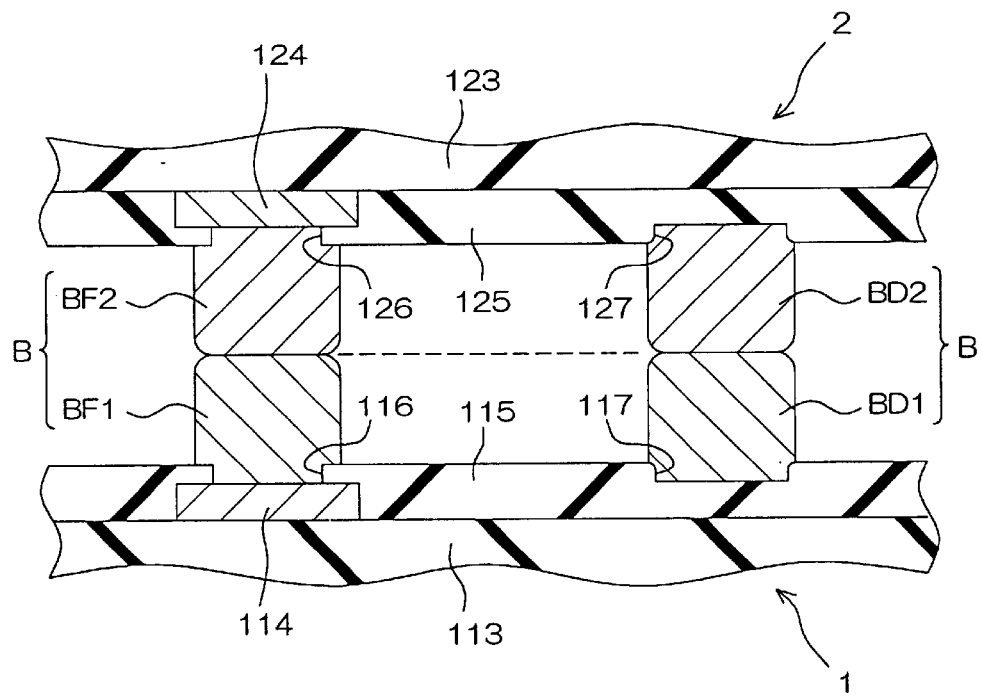
FIG. 20 is an enlarged sectional view illustrating portions of primary and secondary chips according to the eighth embodiment.

FIG. 20 is an enlarged sectional view illustrating portions of the primary chip 1 and the secondary chip 2. In this embodiment, the functional bumps BF2 and dummy bumps BD2 of the secondary chip 2 are respectively bonded to the opposed functional bumps BF1 and dummy bumps BD1 of the primary chip 1, whereby the secondary chip 2 is supported on the primary chip 1 and electrically connected to the primary chip 1. That is, the bumps B provided between the primary chip 1 and the secondary chip 2 are constituted by the functional bumps BF1 and BF2 or the dummy bumps BD1 and BD2 thus bonded to each other.

An inter-level insulating film 113 such as of silicon oxide is provided on a semiconductor substrate (not shown) which serves as a base of the primary chip 1, and an internal interconnection 114 is provided on the inter-level insulating film 113. The inter-level insulating film 113 and the interconnection 114 are covered with a surface protective film 115 such as of silicon nitride. The surface protective film 115 has an opening 116 formed therein for exposing a portion of the interconnection 114. A functional bump BF1 of an oxidation-resistant metal such as gold, platinum, silver, palladium or iridium is provided on the portion of the interconnection 114 exposed through the opening 116 as projecting above the surface protective film 115. The surface protective film 115 further has a recess 117 formed in a region thereof where the functional bump BF1 is not formed, and a dummy bump BD1 is provided on the recess 117 as projecting therefrom.

On the other hand, the secondary chip 2 has substantially the same construction as the primary chip 1. More specifically, an inter-level insulating film 123 such as of silicon oxide is provided on a semiconductor substrate (not shown) which serves as a base of the secondary chip 2, and an internal interconnection 124 is provided on the inter-level insulating film 123. The inter-level insulating film 123 and the interconnection 124 are covered with a surface protective film 125 such as of silicon nitride. The surface protective film 125 has an opening 126 formed therein in association with the functional bump BF1 of the primary chip 1 for exposing a portion of the interconnection 124. A functional bump BF2 of an oxidation-resistant metal such as gold, platinum, silver, palladium or iridium for the secondary chip 2 is provided on the portion of the interconnection 124 exposed through the opening 126 as projecting above the surface protective film 125. The surface protective film 125 further has a recess 127 formed in association with the dummy bump BD1 of the primary chip 1 in a region thereof where the functional bump BF2 is not formed, and a dummy bump BD2 of the secondary chip 2 is provided on the recess 127 as projecting therefrom.

The dummy bump BD1 and the functional bump BF1 or the dummy bump BD2 and the functional bump BF2 are composed of the same bump material, and may be formed in the same process step. In the case of the primary chip 1, for example, the opening 116 is first formed in the surface protective film 115. Thereafter, a resist pattern having an opening for the recess 117 is formed on the surface protective film 115, and then the surface protective film 115 is etched with the use of the resist pattern as a mask, whereby the recess 117 is formed in the surface protective film 115. In turn, the bump material is selectively deposited on the surface of the surface protective film 115 formed with the opening 116 and the recess 117 by plating. Thus, the functional bump BF1 and the dummy bump BD1 are provided as having substantially the same height.

The recess 117 is formed so that its bottom is located at the same level as the surface portion of the interconnection 114 exposed through the opening 116. Therefore, the functional bump BF1 and the dummy bump BD1 are formed as having substantially the same height by evenly depositing the bump material on the interconnection 114 and the recess 117 in the plating step, so that the functional bump BF1 has substantially the same projection height as the dummy bump BD1 with respect to the surface of the surface protective film 115. Similarly, the functional bump BF2 and the dummy bump BD2 of the secondary chip 2 can be formed as having substantially the same height. Therefore, the functional bump BF2 has substantially the same projection height as the dummy bump BD2 with respect to the surface of the surface protective film 125.

Thus, the functional bump BF2 and dummy bump BD2 of the secondary chip 2 can assuredly be connected to the functional bump BF1 and dummy bump BD1, respectively, of the primary chip 1 when the secondary chip 2 is bonded to the primary chip 1. Therefore, the electrical connection between the primary chip 1 and the secondary chip 2 can assuredly be established by the functional bumps BF1, BF2, while mechanical connection between the primary chip and the secondary chip can assuredly be established by the functional bumps BF1, BF2 and the dummy bumps BD1, BD2.

Figure 21A:
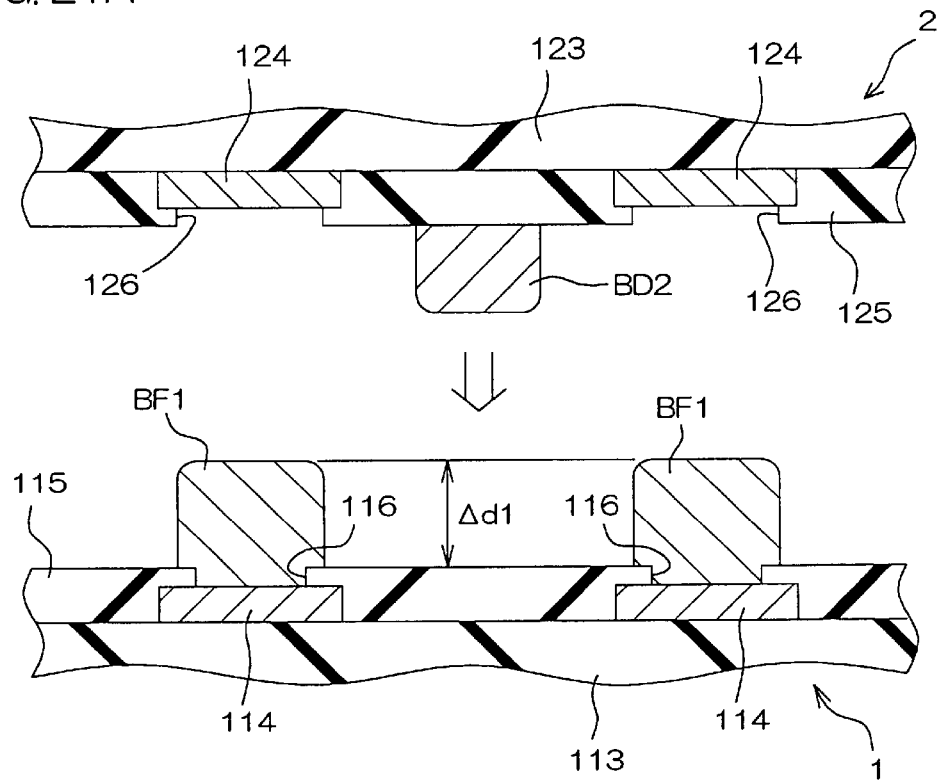
FIGS. 21A and 21B are enlarged sectional views illustrating a portion of a semiconductor device according to a ninth embodiment of the invention.
Figure 21B:
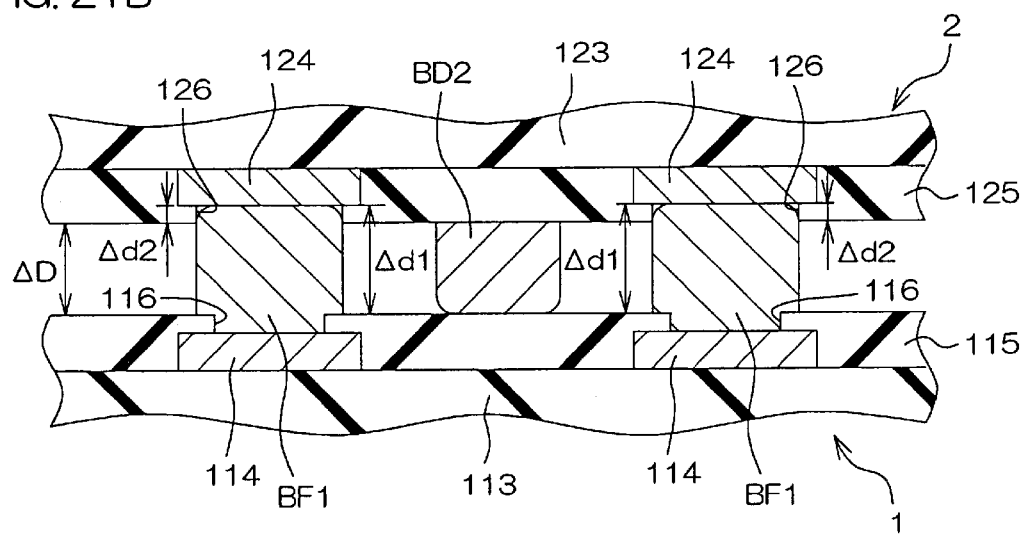

FIGS. 21A and 21B are enlarged sectional views illustrating a portion of a semiconductor device according to a ninth embodiment of the invention. Particularly, FIG. 21A illustrates a primary chip 1 and a secondary chip 2 yet to be bonded to each other, and FIG. 21B illustrates the primary chip 1 and the secondary chip 2 bonded to each other. In FIGS. 21A and 21B, portions corresponding to those illustrated in FIG. 20 are denoted by the same reference characters as in FIG. 20.

In this embodiment, the secondary chip 2 is provided with no functional bump, so that surface portions of internal interconnections 124 are exposed through openings 126 formed in a surface protective film 125. When the primary chip 1 and the secondary chip are bonded to each other, distal end portions of functional bumps BF1 of the primary chip 1 are respectively fitted in the openings 126 of the secondary chip 2, so that the functional bumps BF1 are respectively connected to the internal interconnections 124. The primary chip 1 is provided with no dummy bump, while the secondary chip 2 is provided with a dummy bump BD2. Unlike the eighth embodiment, the recess for adjustment of the height of the dummy bump BD2 is not formed in the surface protective film 125.

The dummy bump BD2 projects to a projection height which is equal of a distance ΔD defined between a surface protective film 115 of the primary chip 1 and the surface protective film 125 of the secondary chip 2 when the primary chip 1 and the secondary chip 2 are bonded to each other. In other words, the projection height of the dummy bump BD2 with respect to the surface protective film 125 is virtually equal to a difference between a projection height Δd1 of the functional bump BF1 with respect to the surface protective film 115 and an insertion depth Δd2 of the functional bump BF1 inserted in the opening 126.

Thus, the functional bumps BF1 of the primary chip 1 can respectively be connected to the internal interconnections 124 of the secondary chip 2 and the dummy bump BD2 can be bonded to the surface of the surface protective film 115 of the primary chip 1, when the primary chip 1 and the secondary chip 2 are bonded to each other. Therefore, the electrical connection and mechanical connection between the primary chip 1 and the secondary chip 2 can be established as in the eighth embodiment.

The primary chip 1 is formed with the functional bumps BF1 each having a predetermined height, while the secondary chip 2 is formed with the dummy bump BD2 having a predetermined height. Therefore, the primary chip 1 and the secondary chip 2 can each be formed through a simplified process, so that costs for the production of the primary chip 1 and the secondary chip 2 are not increased.

Although the functional bumps BF1 are provided on the primary chip 1 and the dummy bump BD2 is provided on the secondary chip 2 in this embodiment, the primary chip 1 may be provided with a dummy bump and the secondary chip 2 may be provided with functional bumps to be fitted in openings 116 of the primary chip 1. In this case, the dummy bump of the primary chip 1 projects from the surface of the surface protective film 115 to a projection height which is virtually equal to a difference between a projection height of the functional bumps of the secondary chip 2 with respect to the surface of the surface protective film 125 and an insertion depth of the functional bumps to be inserted in the openings 116.

Figure 22A:
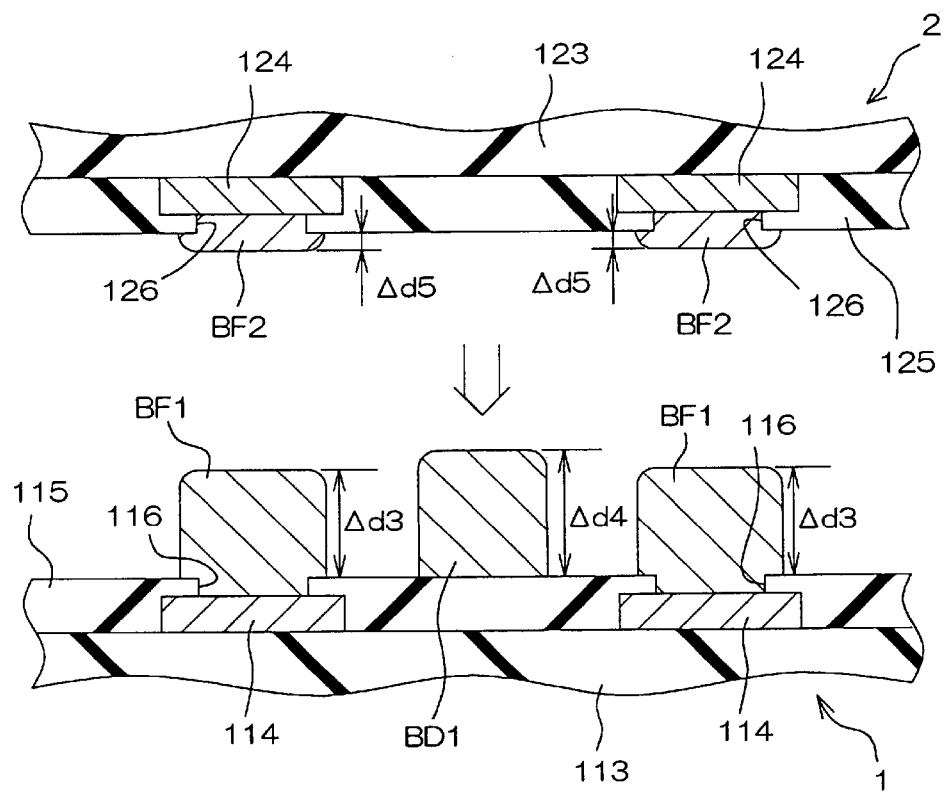
FIGS. 22A and 22B are enlarged sectional views illustrating a portion of a semiconductor device according to a tenth embodiment of the invention.
Figure 22B:
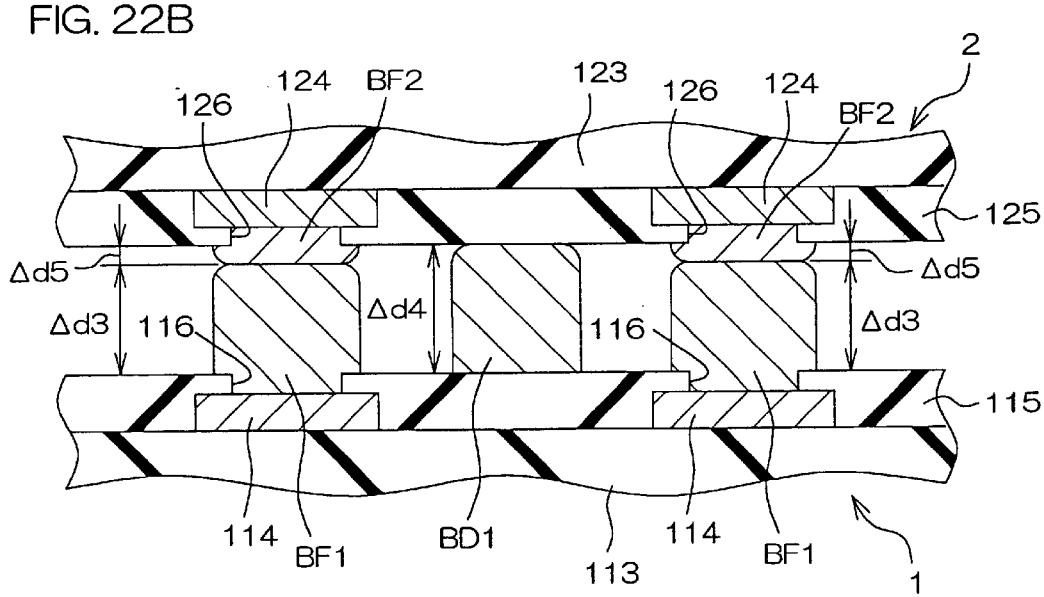
Figure 23:
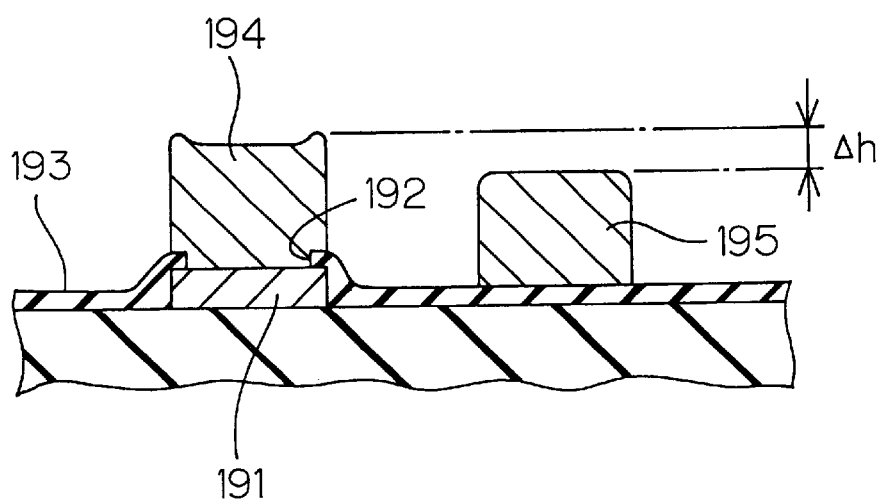
FIG. 23 is a sectional view for explaining a problem to be encountered when a dummy bump and a functional bump are formed in the same process step.
Figure 24:
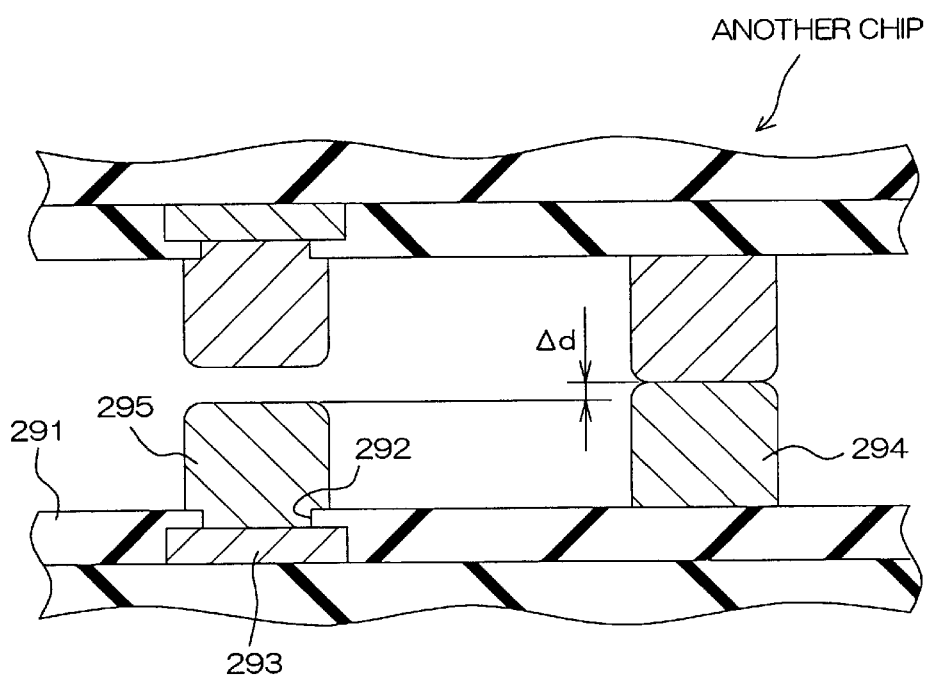
FIG. 24 is a sectional view for explaining another problem to be encountered when a dummy dump and a functional bump are formed in the same process step.
Figure 25:
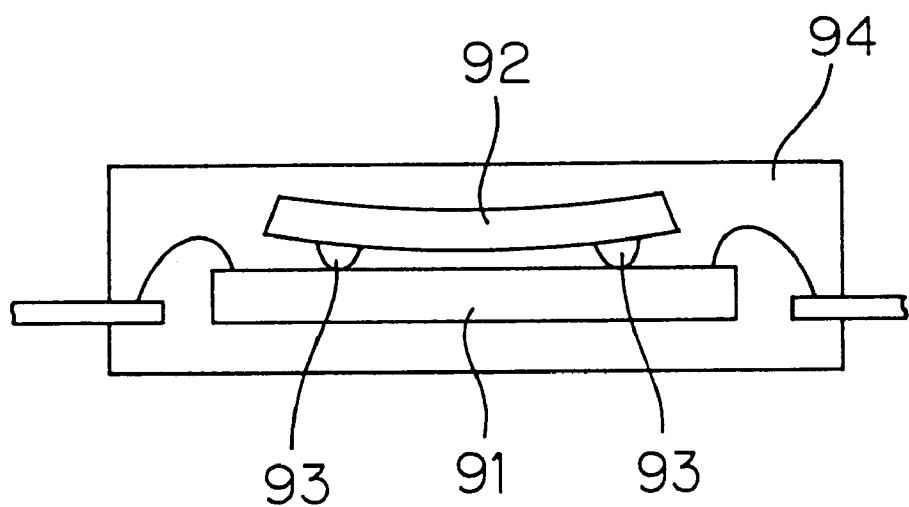
FIG. 25 is a schematic sectional view for explaining a problem associated with a conventional chip-on-chip structure.

FIGS. 22A and 22B are enlarged sectional views illustrating a portion of a semiconductor device according to a tenth embodiment of the invention. Particularly, FIG. 22A illustrates a primary chip 1 and a secondary chip 2 yet to be bonded to each other, and FIG. 22B illustrates the primary chip 1 and the secondary chip 2 bonded to each other. In FIGS. 22A and 22B, portions corresponding to those illustrated in FIG. 20 are denoted by the same reference characters as in FIG. 20.

In this embodiment, the primary chip 1 has functional bumps BF1 and a dummy bump BD1 provided on a surface protective film 115 as projecting therefrom. The functional bumps BF1 and the dummy bump BD1 are formed as having substantially the same height in the same process step. On the other hand, the secondary chip 2 has functional bumps BF2 provided on a surface protective film 125 as projecting therefrom. Unlike the embodiments shown in FIGS. 19 and 20, the secondary chip does not have any dummy bump which does not serve for electrical connection to the primary chip 1. Further, no recess for adjustment of the height of the dummy bump BD1 is formed in the surface protective film 115 of the primary chip 1.

The functional bumps BF2 of the secondary chip 2 each project to a projection height Δd5 which corresponds to a difference between a projection height Δd3 of the functional bumps BF1 and a projection height Δd4 of the dummy bump BD1 with respect to the surface of the surface protective film 115 of the primary chip 1. Thus, the functional bumps BF1 of the primary chip 1 can respectively be connected to the functional bumps BF2 of the secondary chip 2 and the dummy bump BD1 of the primary chip 1 can be bonded to the surface of the surface protective film 125 of the secondary chip 2, when the primary chip 1 and the secondary chip 2 are bonded to each other. Therefore, the electrical connection and mechanical connection between the primary chip 1 and the secondary chip 2 can assuredly be established as in the eighth and ninth embodiments.

The primary chip 1 is formed with the functional bumps BF1 and the dummy bump BD1 each having a predetermined height, while the secondary chip 2 is formed with the functional bumps BF2 each having a predetermined height. Therefore, the primary chip 1 and the secondary chip 2 can each be formed through a simplified process, so that the costs for the production of the primary chip 1 and the secondary chip 2 are not increased.

Although the dummy bump BD1 is provided on the primary chip 1 in this embodiment, a dummy bump may be provided instead of the dummy bump BD1 on the secondary chip 2.

Although the primary chip and the secondary chip are each comprised of a silicon chip in the embodiments described above, any other semiconductor chips such as of compound semiconductors (e.g., gallium arsenide semiconductor) and a germanium semiconductor may be employed. In this case, the primary chip and the secondary chip may be composed of the same semiconductor material or different semiconductor materials.

The aforesaid embodiments are directed to the chip-on-chip structure, but the semiconductor chip according to the present invention are applicable to a flip-chip-bonded structure in which the semiconductor chip is bonded on a printed wiring board with its face opposed to the printed wiring board.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Application No. 11-29842 filed on Feb. 8, 1999, Japanese Patent Application No. 11-33116 filed on Feb. 10, 1999, Japanese Patent Application No. 11-40400 filed on Feb. 18, 1999, Japanese Patent Application No. 11-51212 filed on Feb. 26, 1999, and Japanese Patent Application No. 11-265739 filed on Sep. 20, 1999, the disclosure thereof being incorporated herein by reference.

What is claimed is:

1. A semiconductor chip, comprising:
   a semiconductor substrate having a low impedance portion;
   a functional bump provided on a surface of the semiconductor substrate for electrical connection between an internal circuit provided on the semiconductor substrate and a solid device; and
   a dummy bump provided on the surface of the semiconductor substrate and not serving for electrical connection between the internal circuit and the solid device yet electrically connected to the low impedance portion of the semiconductor substrate, the dummy bump provided in a scribe line region of the semiconductor substrate.

2. The semiconductor chip as set forth in claim 1, wherein the dummy bump is a stress relieving bump for relieving a stress applied thereto.

3. The semiconductor chip as set forth in claim 1, wherein the dummy bump is a dummy bump formed in the same step of a production process as the functional bump.

4. The semiconductor chip as set forth in claim 1, wherein the functional bump is provided in an active region formed with a functional device.

5. A semiconductor chip which is to be bonded to a surface of a solid device via a connection member for electrical connection between an internal circuit thereof and the solid device, the semiconductor chip comprising:

a low impedance portion disposed on the semiconductor chip; and a dummy bump provided on a surface of the semiconductor chip opposed to the surface of the solid device and not serving for electrical connection between the internal circuit of the semiconductor chip and the solid device, the dummy bump provided in a scribe line region of the semiconductor chip and electrically connected to the low impedance portion of the semiconductor chip;

wherein the dummy bump has a height determined on the basis of a distance defined between the surface of the solid device and the surface of the semiconductor chip by the connection members.

6. A semiconductor device, comprising:

a solid device;

a semiconductor chip mounted and bonded onto a surface of the solid device;

a functional bump for electrical connection between an internal circuit of the semiconductor chip and the solid device; and a dummy bump not serving for electrical connection between the internal circuit and the solid device wherein at least one of the solid device and the semiconductor chip includes a low impedance portion and the dummy bump is electrically connected to the low impedance portion, the dummy bump provided in a scribe line region of the semiconductor chip.

7. The semiconductor device as set forth in claim 6, wherein the functional bump is disposed in association with an active region of the semiconductor chip formed with a functional device.

8. The semiconductor device as set forth in claim 7, wherein the dummy bump has a greater contact area in contact with the solid device than the functional bump.

* * * * *